US012708015B2

(12) United States Patent
Huang et al.

(10) Patent No.: US 12,708,015 B2
(45) Date of Patent: Aug. 11, 2026

(54) SEMICONDUCTOR DEVICE HAVING ROUTING STRUCTURE

(71) Applicant: Monolithic Power Systems, Inc., Kirkland, WA (US)

(72) Inventors: Po-Hsien Huang, New Taipei City (TW); Yu-Huei Lee, New Taipei City (TW); Hsin-Hung Lin, New Taipei City (TW); Chun-Yuan Shih, New Taipei City (TW); Lien-Chieh Yu, New Taipei City (TW)

(73) Assignee: Monolithic Power Systems, Inc., Kirkland, WA (US)

( * ) Notice: Subject to any disclaimer, the term of this patent is extended or adjusted under 35 U.S.C. 154(b) by 505 days.

(21) Appl. No.: 18/470,592

(22) Filed: Sep. 20, 2023

(65) Prior Publication Data

US 2024/0113010 A1 Apr. 4, 2024

(30) Foreign Application Priority Data

Sep. 29, 2022 (CN) ......................... 202211199969.7

(51) Int. Cl.
*H10W 72/00* (2026.01)

(52) U.S. Cl.
CPC .................................. *H10W 72/00* (2026.01)

(58) Field of Classification Search
None
See application file for complete search history.

(56) References Cited

U.S. PATENT DOCUMENTS 5,412,239 A 5/1995 Williams
7,312,530 B2 12/2007 Hashimoto
7,586,143 B2 9/2009 Watanabe
8,049,249 B1 * 11/2011 Cheng .................. H10W 42/60 257/E23.07
10,340,317 B2 7/2019 Oh
2004/0084776 A1 * 5/2004 Fukuda .................. H10D 30/65 257/E29.12
2013/0037934 A1 * 2/2013 Lin ..................... H10W 20/427 257/737
2013/0181337 A1 * 7/2013 Herder ................. H10W 20/43 257/734

FOREIGN PATENT DOCUMENTS

TW 200512857 A 4/2005
TW 200713500 A 4/2007
TW 202118042 A 5/2021

* cited by examiner

*Primary Examiner* — Cory W Eskridge
(74) *Attorney, Agent, or Firm* — Ashurst Perkins Coie US LLP

(57) ABSTRACT

A semiconductor device is disclosed herein. The semiconductor device includes a routing structure. The routing structure has an intermediate conductive routing layer. The intermediate conductive routing layer includes a first mesh conductive layer formed in a predetermined second region of the semiconductor device and a second mesh conductive layer formed in a predetermined first region of the semiconductor device. The first mesh conductive layer and the second mesh conductive layer are electrically isolated from each other. The intermediate conductive routing layer further includes multiple first conductive islands formed in the predetermined first region and multiple second conductive islands formed in the predetermined second region.

44 Claims, 19 Drawing Sheets

SEMICONDUCTOR DEVICE HAVING ROUTING STRUCTURE

CROSS-REFERENCE TO RELATED APPLICATIONS

This application claims priority to and the benefit of Chinese Patent Application 202211199969.7, filed on Sep. 29, 2022, which is incorporated herein by reference in its entirety.

TECHNICAL FIELD

The present disclosure relates to a semiconductor integrated circuit ("IC") device. More particularly but not exclusively, the present disclosure relates to a semiconductor IC device having wiring or routing structures.

BACKGROUND OF THE INVENTION

Integrating more IC chips and components with smaller sizes onto an IC product or system circuit board (i.e., improving integration density) has been a dominant trend for semiconductor industry. IC chips and dies are usually packaged into the forms that can be soldered, installed, or inserted onto the system circuit board. The packaged IC chips have input/output (I/O) pins or solder bumps that allow the IC chip to electrically connect to external circuits and exchange signals with them. However, although the integration density of ICs is increased by optimized semiconductor manufacturing processes, current package wiring or routing solution deters the integration level and the size of ICs from being further improved.

SUMMARY OF THE INVENTION

According to an embodiment of the present disclosure, a semiconductor device is provided. The semiconductor device includes a routing structure. The routing structure has an intermediate conductive routing layer. The intermediate conductive routing layer includes a first mesh conductive layer formed in a predetermined second region of the semiconductor device and a second mesh conductive layer formed in a predetermined first region of the semiconductor device. The first mesh conductive layer and the second mesh conductive layer are electrically isolated from each other. The intermediate conductive routing layer further includes multiple first conductive islands formed in the predetermined first region and multiple second conductive islands formed in the predetermined second region.

According to an embodiment of the present disclosure, a semiconductor device is provided. The semiconductor device includes a routing structure and a lower conductive routing layer. The routing structure is formed on a substrate. The routing structure includes an intermediate conductive routing layer having a first mesh conductive layer and a second mesh conductive layer disposed respectively in a predetermined second region and a predetermined first region of the semiconductor device. The first mesh conductive layer and the second mesh conductive layer are electrically isolated from each other. The lower conductive routing layer is formed below the intermediate conductive routing layer. The lower conductive routing layer comprises multiple first conductive buses and multiple second conductive buses that extend in a first direction and are arranged in an alternate order along a second direction that is perpendicular to the first direction.

BRIEF DESCRIPTION OF THE DRAWINGS

The present disclosure can be further understood with reference to following detailed description and appended drawings, wherein like elements are provided with like reference numerals. These drawings are only for illustration purpose, thus may only show part of the devices and are not necessarily drawn to scale.

DETAILED DESCRIPTION

Various embodiments of the present disclosure will now be described. In the following description, some specific details, such as example circuits and example values for these circuit components, are included to provide a thorough understanding of embodiments. One skilled in the relevant art will recognize, however, that the present disclosure can be practiced without one or more specific details, or with other methods, components, materials, etc. In other instances, well-known structures, materials, processes or operations are not shown or described in detail to avoid obscuring aspects of the present disclosure.

Throughout the specification and claims, the terms “left”, “right”, “in”, “out”, “front”, “back”, “up”, “down”, “top”, “atop”, “bottom”, “on”, “over”, “under”, “above”, “below”, “vertical” and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The phrases “in one embodiment”, “in some embodiments”, “in one implementation”, and “in some implementations” as used includes both combinations and sub-combinations of various features described herein as well as variations and modifications thereof. These phrases used herein does not necessarily refer to the same embodiment, although it may. Those skilled in the art should understand that the meanings of the terms identified above do not necessarily limit the terms, but merely provide illustrative examples for the terms. It is noted that when an element is “connected to” or “coupled to” the other element, it means that the element is directly connected to or coupled to the other element, or indirectly connected to or coupled to the other element via another element. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale. The terms “first”, “second”, etc. are used only to distinguish one component from other components but not to indicate that there is any order among the components.

Figure 1:
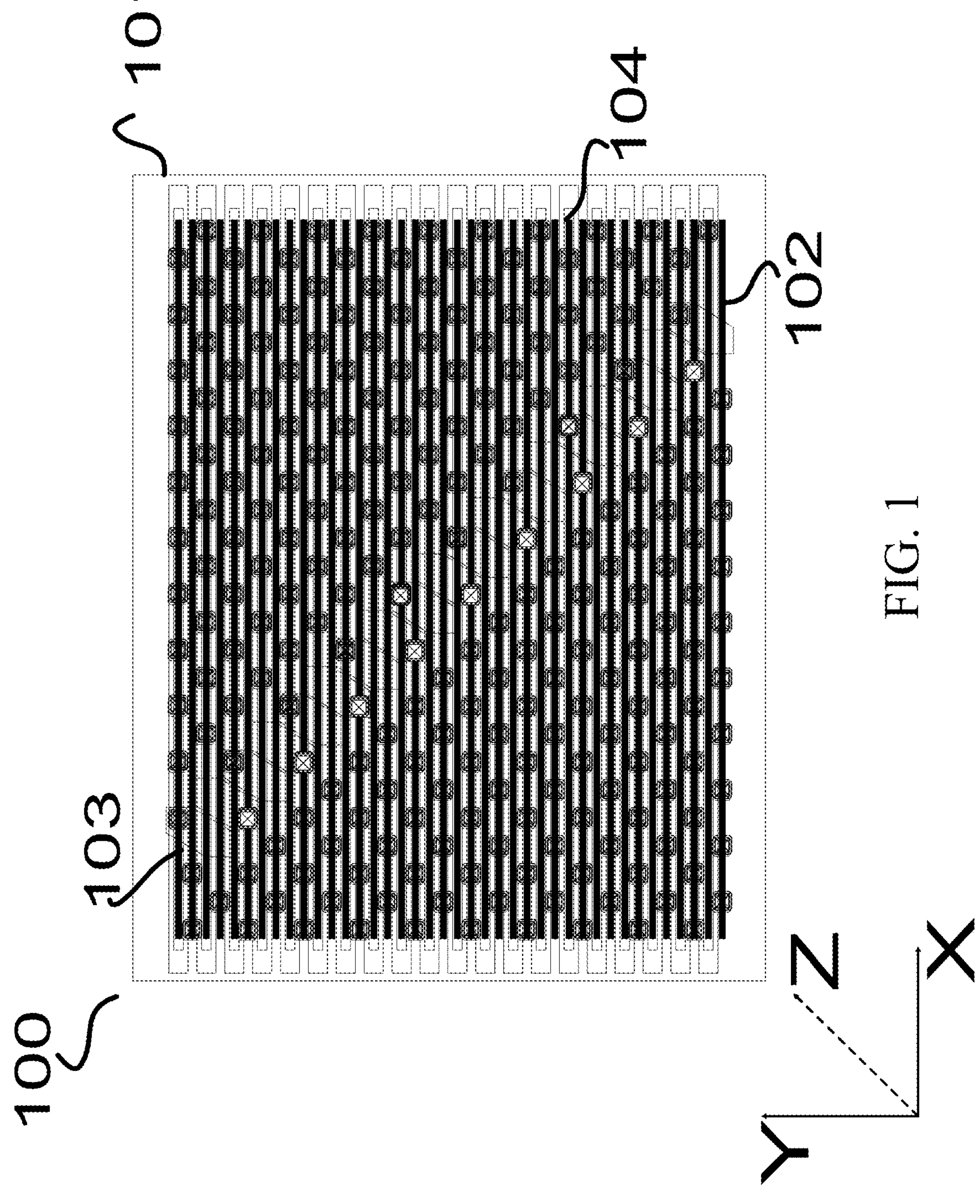
FIG. 1 illustrates a perspective view of a semiconductor device 100 in accordance with an embodiment of the present disclosure.

FIG. 1 illustrates a perspective view of a semiconductor device 100 in accordance with an embodiment of the present disclosure. In some embodiments, the semiconductor device 100 is an integrated circuit (IC) chip or die. For illustration of FIG. 1, the semiconductor device 100 is illustrated in a coordinate system defined by X, Y, and Z axes that are perpendicular to each other, and the perspective view of the semiconductor device 100 in the X-Y plane is shown. In some embodiments, the semiconductor device 100 includes IC units, modules, or components. For example, in one embodiment, the semiconductor device 100 may include a high-power switching unit, such as a double-diffused metal-oxide-semiconductor (“DMOS”) field effect transistor (“FET”). In one embodiment, the semiconductor device 100 may further include a driving unit configured to drive the high-power switching unit. The driving unit may be configured to provide a driving voltage or current to a control terminal of the high-power switching unit. In one embodiment, the semiconductor device 100 may further include a controlling unit configured to turn on or off the high-power switching unit. It will be understood by persons having ordinary skills in the art that, according to actual applications and design needs, the semiconductor device 100 may further include IC units, modules, or components that have other functions or features. The present disclosure does not intend to limit the embodiments in this respect.

Still with reference to FIG. 1, in some embodiments, the semiconductor device 100 may include a routing structure formed on a substrate 101. The routing structure may include at least one conductive routing layer that may be configured to electrically couple or lead out the nodes and terminals of the IC units, modules, or components that are formed in the substrate 101, including active regions of transistors (such as source/emitter, drain/collector, and gate/base) etc. Accordingly, the IC units, modules, or components can be electrically coupled to external circuits and exchange signals with external circuits. It will be understood by persons having ordinary skills in the art that the substrate 101 may include semiconductor materials such as Si, Ge, SiC, GaN, SiGe, etc. The substrate 101 may alternatively include silicon-on-insulator (“SOI”) substrate or other forms of substrate that are compatible with the operation and manufacturing process of the semiconductor device 100. In one embodiment, the at least one conductive routing layer may involve or constitute a portion of a metal layer formed on the substrate 101. In the exemplary embodiment of FIG. 1, the at least one conductive routing layer may include a first conductive routing layer 102, a second conductive routing layer 103, and a third conductive routing layer 104. It will be understood by persons having ordinary skills in the art that the number of the conductive routing layers in the at least one conductive routing layer is merely exemplary and does not intend to limit the present disclosure, and that the number can be modified and determined based on actual needs of electrical connection and routing. In some embodiments, an inter-layer dielectric layer may be formed between any two adjacent conductive routing layers (i.e., the conductive layers that are adjacent to each other in the Z-axis direction) of the at least one conductive routing layer. For the purpose of clarity, the inter-layer dielectric layer is not shown in FIG. 1. The inter-layer dielectric layer will be described in later paragraphs in combination with FIGS. 1, 3A-3B, and 7.

Figure 2A:
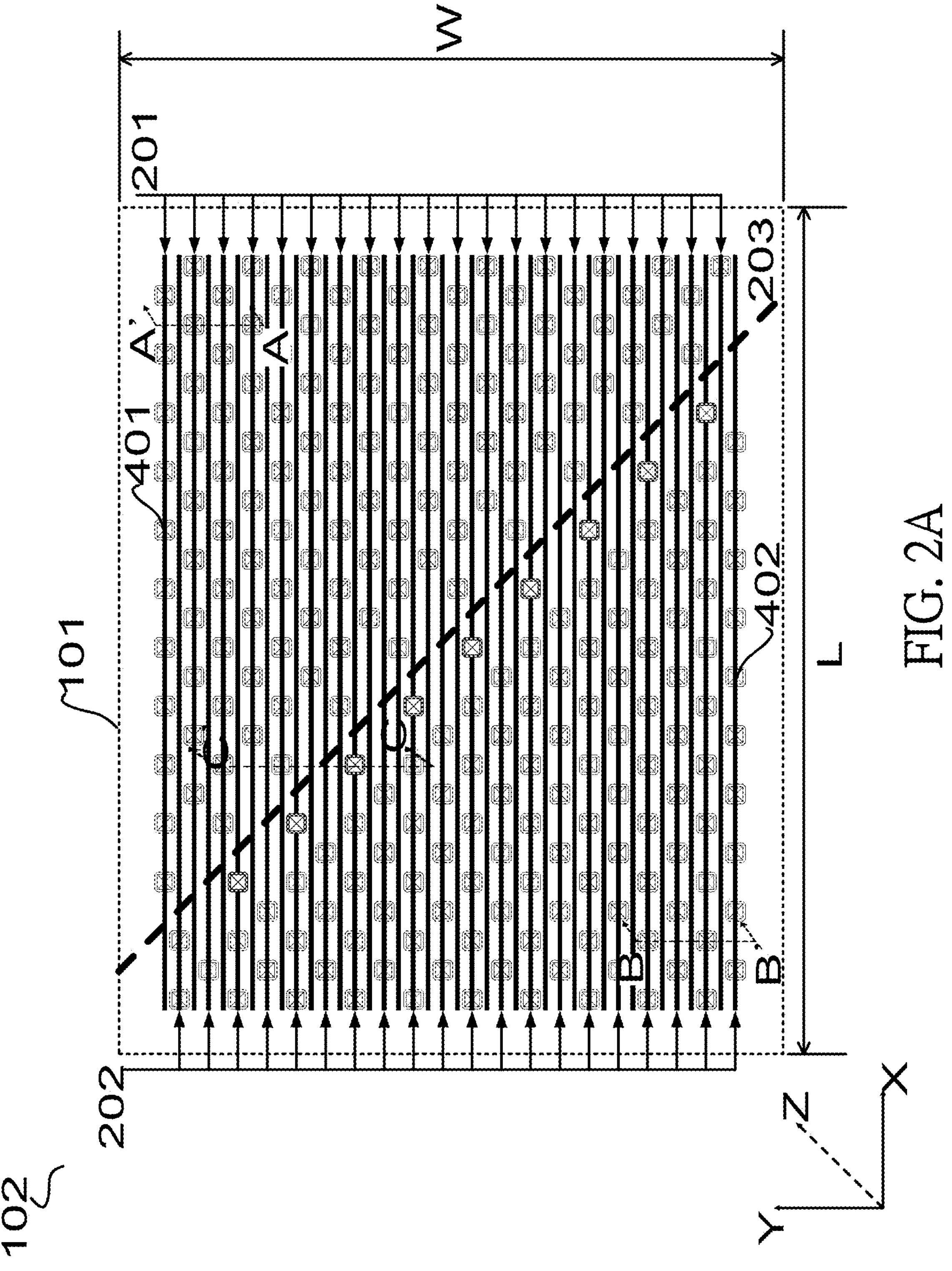
FIGS. 2A-2B illustrate top views of a first conductive routing layer 102 of the semiconductor device 100 in an X-Y plane in accordance with an embodiment of the present disclosure.

FIG. 2A illustrates a top view of the first conductive routing layer 102 of the semiconductor device 100 in the X-Y plane in accordance with an embodiment of the present disclosure. The first conductive routing layer 102 may include first conductive buses 201 and second conductive buses 202. The first conductive buses 201 and the second conductive buses 202 are illustrated as black solid lines that are parallel with each other and extend along the X-axis direction. A set of arrows pointing left is used to indicate the first conductive buses 201, and another set of arrows pointing right is used to indicate the second conductive buses 202. In some embodiments, conductive buses (e.g., the first conductive buses 201 and the second conductive buses 202) can also be referred to as conductive traces.

The first conductive buses 201 and the second conductive buses 202 extend in the X-axis direction, are parallel with each other, and do not contact with each other. The first conductive buses 201 and the second conductive buses 202 are arranged in an alternate or interdigit order along the Y-axis direction. Accordingly, as shown in FIG. 2A, a pattern of “one first conductive bus 201 and then one second conductive bus 202” is repeated across the substrate 101 along the Y-axis direction. In one embodiment, each of the first conductive buses 201 and the second conductive buses 202 extends across the length L of the substrate 101 in the X-axis direction. In one embodiment, when the semiconductor device 100 is used to build an actual application system, the first conductive buses 201 may be configured to couple to and transmit a first voltage, and the second conductive buses 201 may be configured to couple to and transmit a second voltage. The first and second voltages have different voltage levels with respect to a reference ground voltage. In other words, there is a voltage difference between the first and second voltages.

For example, in the embodiment where the semiconductor device 100 includes the high-power switching unit (e.g., a DMOS FET), the first conductive buses 201 are configured to couple to and transmit a voltage of a source terminal (hereinafter referred to as a source voltage) of the DMOS FET, and the second conductive buses 202 are configured to couple to and transmit a voltage of a drain terminal (hereinafter referred to as a drain voltage) of the DMOS FET. In one embodiment, each of the second conductive buses 202 may have a width larger than a width of each of the second conductive buses 201 with respect to the Y-axis direction. In one embodiment, a gate conductive layer (e.g., a gate poly-silicon layer) may be formed in or on the substrate 101 and may be patterned to include for instance gate conductive structures 105 shown in FIG. 2B. In one embodiment, each gate conductive structure 105 may correspond to a corresponding one first conductive bus 201 of the plurality of first conductive buses 201. For example, as shown in the exemplary embodiment of FIG. 2B, each gate conductive structure 105 surrounds a corresponding one first conductive bus 201. It will be understood by persons having ordinary skills in the art that the gate conductive layer (including the gate conductive structures 105) and the first conductive routing layer 102 (including the first conductive buses 201 and the second conductive buses 202) may not be in the same X-Y plane. In other words, as shown in FIGS. 3A and 3B, there may be a distance or spacing between them in the Z-axis direction.

In one embodiment, a first inter-layer dielectric layer 300 may be formed on the first conductive routing layer 102. Please refer to FIGS. 2A and 3A-3B. FIGS. 3A-3B respectively illustrate cross-sectional views of the semiconductor device 100 in a Y-Z plane along an AA' line and a BB' line in accordance with an embodiment of the present disclosure. First vias 301 and second vias 302 may be formed in the first inter-layer dielectric layer 300. Each of the first vias 301 and the second vias 302 extends through and across the first inter-layer dielectric layer 300 along the Z-axis direction. In one embodiment, the first vias 301 may be formed in the portions of the first inter-layer dielectric layer 300 that are right above the first conductive buses 201, and the second vias 302 are formed in the portions of the first inter-layer dielectric layer 300 that are right above the second conductive buses 202. The first vias 301 are electrically coupled to the first conductive buses 201. Each first via 301 vertically extends from a top surface 300T of the first inter-layer dielectric layer 300, through the first inter-layer dielectric layer 300, to reach and directly contact one of the first conductive buses 201. The second vias 302 are electrically coupled to the second conductive buses 202. Each second vias 302 vertically extends from the top surface 300T of the first inter-layer dielectric layer 300, through the first inter-layer dielectric layer 300, to reach and directly contact one of the second conductive buses 202. In one embodiment, each of the first vias 301 and the second vias 302 is filled with conductive materials (such as W, Co, Ni, Cu, etc. and any combination or alloy thereof).

Figure 2B:
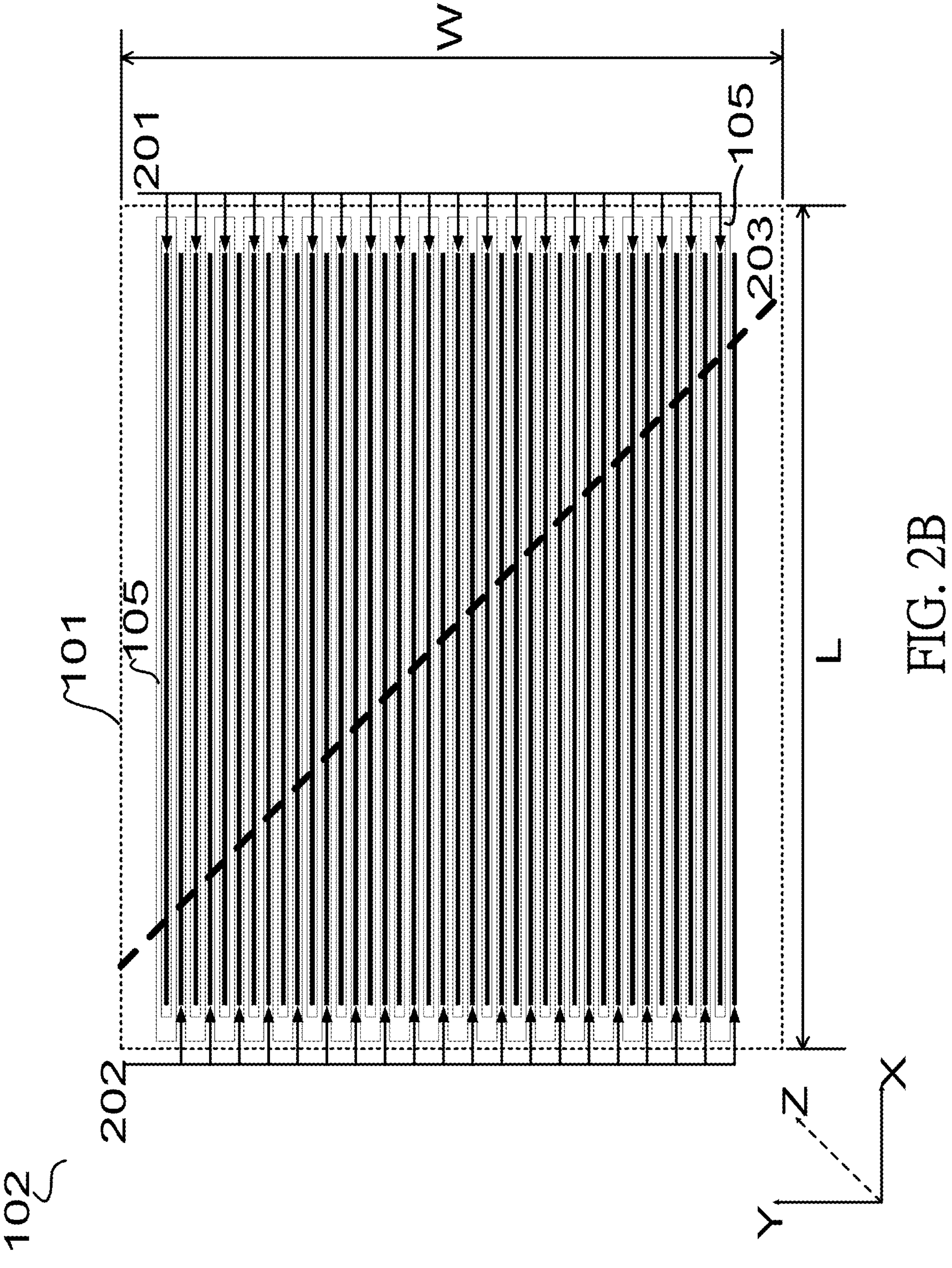
Figure 3A:
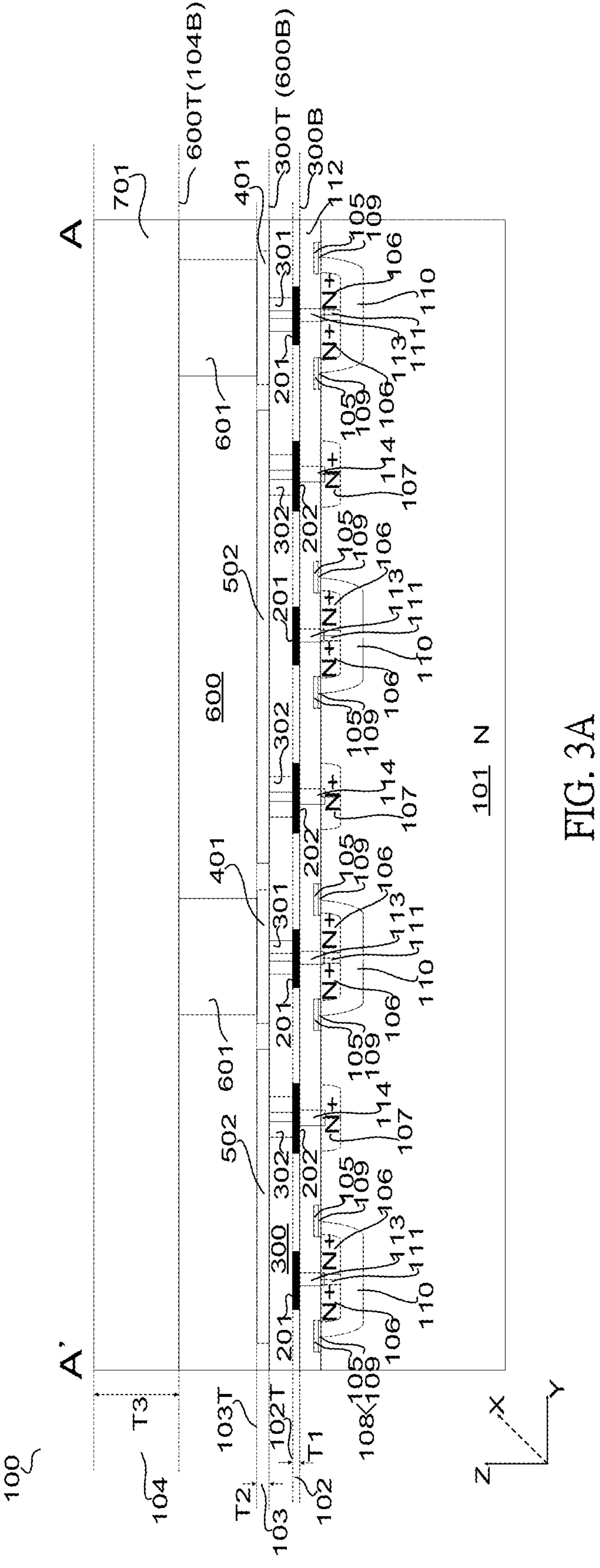
FIGS. 3A-3B respectively illustrate cross-sectional views of the semiconductor device 100 in a Y-Z plane along an AA' line and a BB' line in accordance with an embodiment of the present disclosure.
Figure 3B:
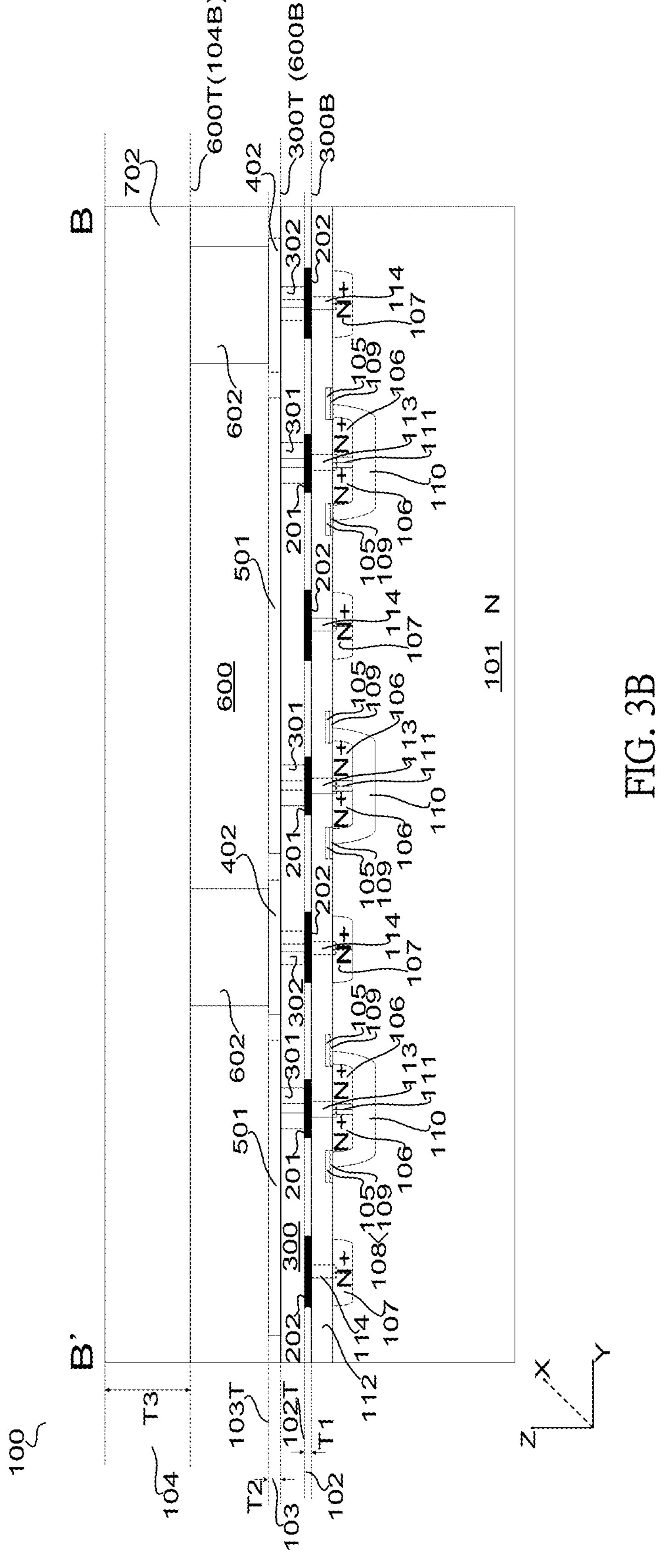

Still with reference to FIGS. 2A-2B, in some embodiments, the semiconductor device 100 (including the substrate 101 and the layers formed on or above the substrate 101 in the Z-axis direction) may be divided into a predetermined first region and a predetermined second region. In the exemplary embodiment of FIGS. 2A-2B, a dashed line 203 indicates the approximate dividing line between the predetermined first region and the predetermined second region. The region at the right side of the dividing line 203 is referred to as the predetermined first region, and the region at the left side of the dividing line 203 is referred to as the predetermined second region.

Figure 4A:
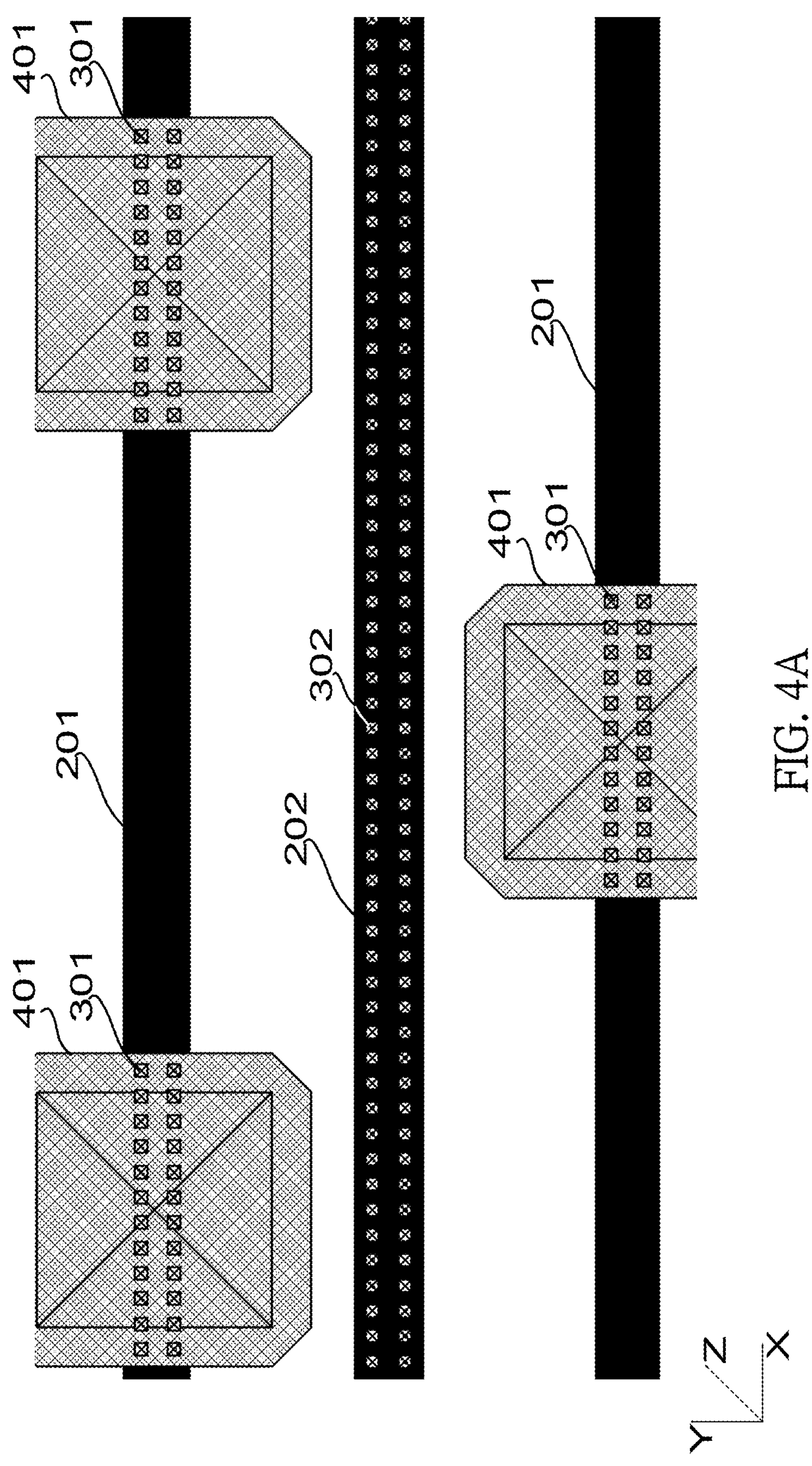
FIGS. 4A-4B respectively illustrate enlarged views of portions of the semiconductor device as shown in FIG. 2A that are in a predetermined first region and in a predetermined second region in accordance with an embodiment of the present disclosure.
Figure 4B:
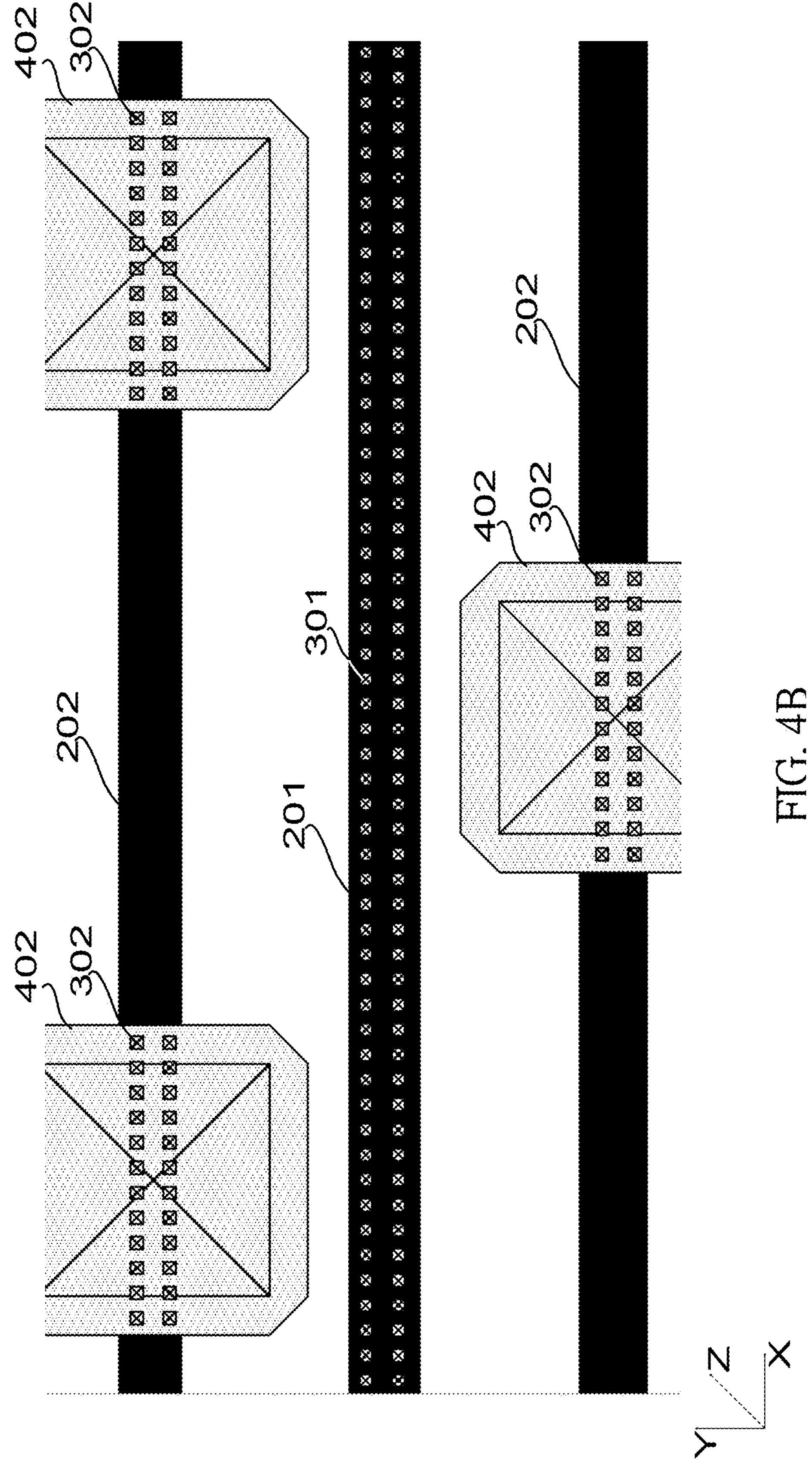

FIGS. 4A-4B respectively illustrate enlarged views of portions of the semiconductor device as shown in FIG. 2A that are in the predetermined first region and in the predetermined second region in accordance with an embodiment of the present disclosure. For illustration of FIGS. 4A-4B, the cross sections of the first vias 301 and the second vias 302 in the X-Y plane are illustrated as small squares each of which has a cross inside. It will be understood by persons having ordinary skills in the art that the square shape of the cross sections of vias are merely exemplary and are used for understanding the present disclosure. In another embodiment, the cross sections of the first vias 301 and the second vias 302 in the X-Y plane may have different shapes including, but not limited to, circle, rectangle, or other polygon that is compatible with the relevant manufacturing process. The present disclosure does not intend to limit the embodiments in this respect.

In one embodiment, the areas of the predetermined first region and the predetermined second region in the X-Y plane are substantially or ideally identical. Accordingly, currents flowing through the first vias 301 and the second vias 302 in the predetermined first region and the predetermined second region can be distributed evenly and smoothly. In one embodiment, an area of the predetermined first region in the X-Y plane and an area of the predetermined second region in the X-Y plane may substantially or ideally be equal to each other. In an embodiment, each of the area of the predetermined first region in the X-Y plane and the area of the predetermined second region in the X-Y plane may substantially or ideally be equal to a half of the area of the semiconductor device 100 (i.e., $\frac{1}{2}\times L\times W$). It will be understood by persons having ordinary skills in the art that the semiconductor devices and products may have tolerable deviations caused during actual manufacturing process. The terms "substantially" and "ideally" used in the present disclosure are to recognize these deviations. Accordingly, embodiments with tolerable deviations are included in the present disclosure.

In one embodiment, the predetermined first region and the predetermined second region may be divided approximately along the diagonal line of the semiconductor device 100 (such as the dividing line 203 in FIGS. 2A-2B), the region at the right side of the dividing line 203 is referred to as the predetermined first region, and the region at the left side of the dividing line 203 is referred to as the predetermined second region. Accordingly, the area of the interface between the predetermined first and predetermined second regions in the Z-axis direction can be maximized, space utilization rate and the efficiency of the routing structures formed in different regions in or on the substrate 101 can be improved, and interconnection or wiring or routing resistance of the routing structures can be reduced. However, it will be understood by persons having ordinary skills in the art that FIGS. 2A-2B are merely exemplary, and the present disclosure does not intend to limit the manner in which the predetermined first and predetermined second regions are divided. The predetermined first and predetermined second regions may be divided in a manner different from the one shown in FIGS. 2A-2B according to actual applications and design needs. For example, in another embodiment, the semiconductor device 100 may be divided by multiple lines that are in parallel with a diagonal line of the semiconductor device 100. That is, the semiconductor device 100 may be divided into more than two regions, or it may also be considered that the predetermined first region or the predetermined second region has sub-regions. In another embodiment, the semiconductor device 100 may be divided by the middle line of the length L or width W of the semiconductor device 100. In another embodiment, the semiconductor device 100 may be divided by a frame that has a projection shape of square, rectangle, circle, etc. in the X-Y plane. It should be understood that different dividing manners are included in the present disclosure and do not go beyond the spirit and scope of the present disclosure.

Figure 5:
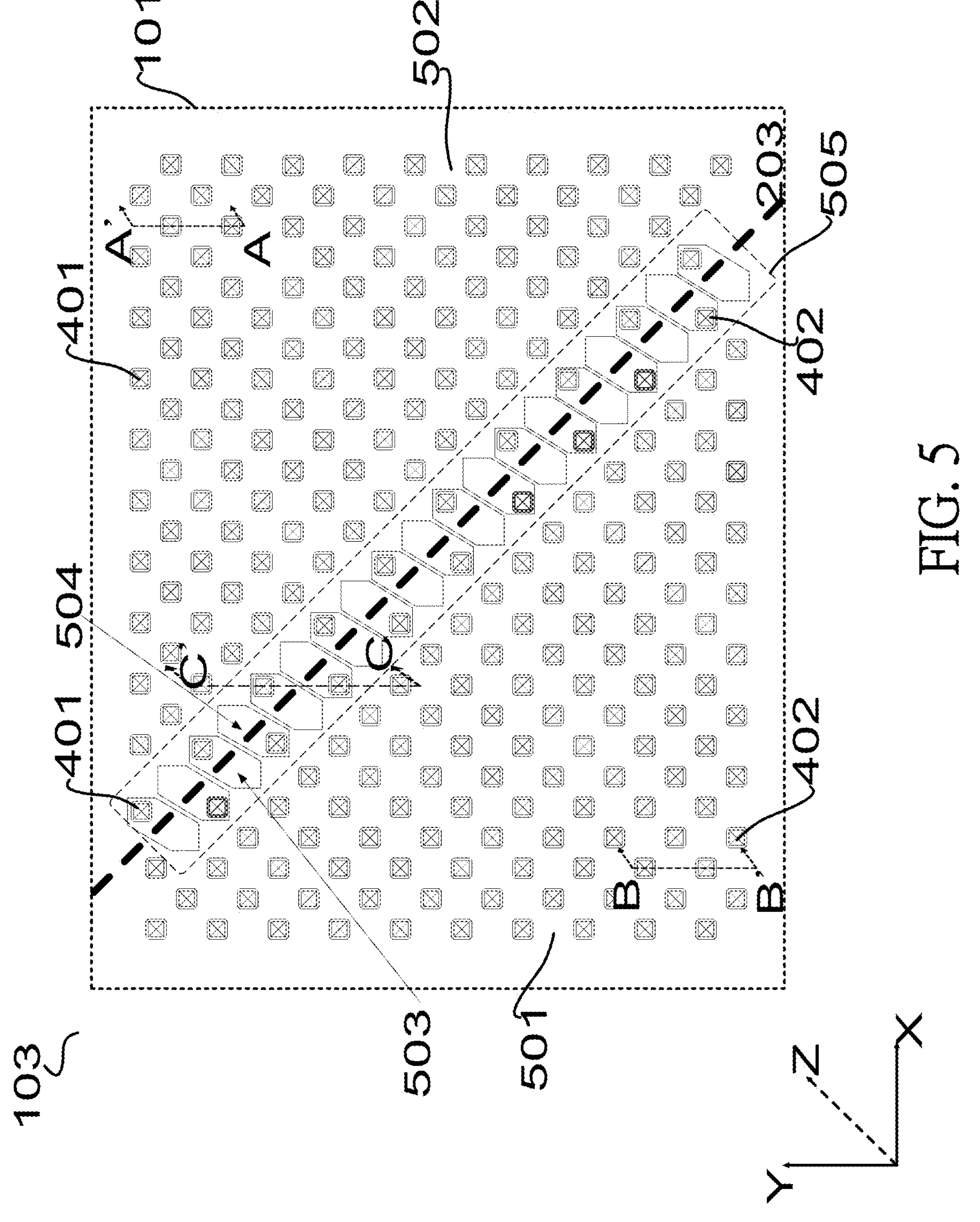
FIG. 5 illustrates a top view of a second conductive routing layer 103 of the semiconductor device 100 in an X-Y plane in accordance with an embodiment of the present disclosure.

FIG. 5 illustrates a top view of the second conductive routing layer 103 of the semiconductor device 100 in the X-Y plane in accordance with an embodiment of the present disclosure. In some embodiments, the second conductive routing layer 103 may be formed on the first inter-layer dielectric layer 300 and may include first conductive islands 401. The first conductive islands 401 may be distributed in the predetermined first region. The first conductive islands 401 may be arranged in multiple rows that are in the direction of the length L of the substrate 101 (i.e., the X-axis direction), or may be arranged in multiple columns that are in the direction of the width W of the substrate 101 (i.e., the Y-axis direction). That is, row refers to distribution/arrangement in the direction of the length L of the substrate 101 (or the X-axis direction) while column refers to distribution/arrangement in the direction of the width W of the substrate 101 (or the Y-axis direction) for the present example. The first conductive islands 401 of every two adjacent or neighboring rows may be arranged in a staggered manner along the Y-axis direction. That is, the first conductive islands 401 of every two adjacent or neighboring rows are not aligned with each other in the Y-axis direction. For instance, the first conductive islands 401 disposed right above every two adjacent first conductive buses 201 may be arranged in a staggered manner along the Y-axis direction. In other words, the first conductive islands 401 disposed right above every two adjacent first conductive buses 201 are not aligned with each other in the Y-axis direction. In FIG. 5, the first conductive islands 401 are illustrated as small squares filled with grids. Each first conductive island 401 may be coupled to one of the first conductive buses 201 through one or more of the first vias 301 (and the conductive materials filled within the first vias 301). For the purpose of better understanding the present disclosure, the first conductive islands 401 are also shown in FIG. 2A. Each small square filled with grids indicates the projection of the first conductive islands 401 on the top surface 102T of the first routing layer 102 (or on the X-Y plane). FIGS. 2A, 3A, and 4A can be referred to in understanding the distribution of the first conductive islands 401 in the X-Y plane and the relative positions and connections between the first conductive islands 401, the first vias 301, and the first conductive buses 201.

Still with reference to FIG. 5, the second conductive routing layer 103 may further include second conductive islands 402. The second conductive islands 402 may be distributed in the predetermined second region. The second conductive islands 402 may be arranged in multiple rows that are in the X-axis direction, or may be arranged in multiple columns that are in the Y-axis direction. That is, row refers to distribution/arrangement in the direction of the length L of the substrate 101 (or the X-axis direction) while column refers to distribution/arrangement in the direction of the width W of the substrate 101 (or the Y-axis direction) for the present example. The second conductive islands 402 of every two adjacent or neighboring rows may be arranged in a staggered manner along the Y-axis direction. That is, the second conductive islands 402 of every two adjacent or neighboring rows are not aligned with each other in the Y-axis direction. For instance, the second conductive islands 402 disposed right above every two adjacent second conductive buses 202 may be arranged in a staggered manner along the Y-axis direction. In other words, the second conductive islands 402 disposed right above every two adjacent second conductive buses 202 are not aligned with each other in the Y-axis direction. In FIG. 5, the second conductive islands 402 are illustrated as small squares filled with dots. Each second conductive island 402 may be coupled to one of the second conductive buses 202 through one or more of the second vias 302 (and the conductive materials filled within the second vias 302). For the purpose of better understanding the present disclosure, the second conductive islands 402 are also shown in FIG. 2A. Each small square filled with dots indicates the projection of the second conductive islands 402 on the top surface 102T of the first routing layer 102 (or on the X-Y plane). FIGS. 2A, 3A, and 4A can be referred to in understanding the distribution of the second conductive islands 402 in the X-Y plane and the relative positions and connections between the second conductive islands 402, the second vias 302, and the second conductive buses 202.

Accordingly, due to the staggered arrangement of the first conductive islands 401 and the second conductive islands 402 in the Y-axis direction, the first conductive buses 201 and the second conductive buses 202 may be arranged more closely in the Y-axis direction. That is, the distance between the adjacent first conductive bus 201 and the second conductive bus 202 in the Y-axis direction can be reduced. Thus, higher density of the first conductive buses 201 and the second conductive buses 202 may be arranged in the limited area of the semiconductor device 100 or the substrate 101. In other words, a higher density of IC units, modules, or components may be formed in the semiconductor device 100, and the level of integration of the semiconductor device 100 can be improved.

In one embodiment, the first conductive islands 401 formed right above the first conductive buses 201 may be arranged in a quincunx pattern, and the second conductive islands 402 above the second conductive buses 202 may be arranged in a quincunx pattern too. In other words, five of the first conductive islands 401 or the second conductive islands 402 may be arranged in a cross, with four of them forming a square or rectangle and a fifth at its center. It will be understood by persons having ordinary skills in the art that the placement and pattern of the first conductive islands 401 and the second conductive islands 402 shown in FIGS. 2A-5 are merely exemplary, and the present disclosure does not intend to limit the embodiments in this respect. In another embodiments, the first conductive islands 401 and the second conductive islands 402 may be arranged in a different pattern. Although each one of the first conductive islands 401 and the second conductive islands 402 are exemplarily shown to have a projection shape of small square, this is just for ease understanding of the present disclosure and not intended to be limiting. In other embodiments, it would be understood by one of ordinary skill in the art that each one of the first conductive islands 401 and the second conductive islands 402 may have a cross section or projection of other predetermined geometric shape in the X-Y plane, such as rectangle, circle, or other multilateral polygon that is compatible with the relevant manufacturing process.

In one embodiment, for the portion of the first inter-layer dielectric layer 300 that is in the predetermined first region, as shown in FIG. 3A, the first vias 301 may be formed right below the first conductive islands 401 and right above the first conductive buses 201. One or more of the first vias 301 corresponds to one of the first conductive islands 401. FIG.

4A can be referred to for better understanding. On the other hand, for the portion of the first inter-layer dielectric layer 300 that is in the predetermined second region, as shown in FIG. 3B, the first vias 301 may be formed right above the first conductive buses 201.

In one embodiment, for the portion of the first inter-layer dielectric layer 300 that is in the predetermined second region, as shown in FIG. 3B, the second vias 302 may be formed right below the second conductive islands 402 and right above the second conductive buses 202. One or more of the second vias 302 corresponds to one of the second conductive islands 402. FIG. 4B can be referred to for better understanding. On the other hand, for the portion of the first inter-layer dielectric layer 300 that is in the predetermined first region, as shown in FIG. 3A, the second vias 302 may be formed right above the second conductive buses 202.

Still with reference to FIG. 5, in one embodiment, the second conductive routing layer 103 may further include a first mesh conductive layer 501 and a second mesh conductive layer 502 that are electrically isolated from each other. As shown in FIG. 5, due to the openings and the conductive islands (e.g., conductive islands 401 and 402) in the first mesh conductive layer 501 and the second mesh conductive layer 502, each of the first mesh conductive layer 501 and the second mesh conductive layer 502 has a mesh-like or web-like shape. The first mesh conductive layer 501 may be arranged and formed in the predetermined second region (e.g., the region at the left side of the dividing line 203 as shown in FIG. 5). The second conductive routing layer 502 may be arranged and formed in the predetermined first region (e.g., the region at the right side of the dividing line 203 as shown in FIG. 5). In FIG. 5, the mesh filled with grids at the left side represents the first mesh conductive layer 501, and the mesh filled with dots at the right side represents the second mesh conductive layer 502. A border region 505 may be between the first mesh conductive layer 501 and the second mesh conductive layer 502. A dashed rectangle is used to indicate the approximate area of the border region 505. At the border region 505, the first mesh conductive layer 501 may have multiple first tooth-shaped structures 503 extending from the first mesh conductive layer 501 to the second mesh conductive layer 502, so that the first mesh conductive layer 501 may have a ragged edge at the border region 505. At the border region 505, the second mesh conductive layer 502 may have multiple second tooth-shaped structures 504 extending from the second mesh conductive layer 502 to the first mesh conductive layer 501, so that the second mesh conductive layer 502 may have a ragged edge at the border region 505. The first tooth-shaped structures 503 and the second tooth-shaped structures 504 may be arranged in an alternate or interdigit order along the dividing line 203 at the border region 505 and may be interspersed with each other to form a zigzag or interdigital pattern. The adjacent first tooth-shaped structures 503 and the second tooth-shaped structures 504 may be electrically isolated from each other. In other words, each first tooth-shaped structure 503 is electrically isolated from the two neighboring second tooth-shaped structures 504, and each second tooth-shaped structure 504 is electrically isolated from the two neighboring first tooth-shaped structures 503.

Figure 6:
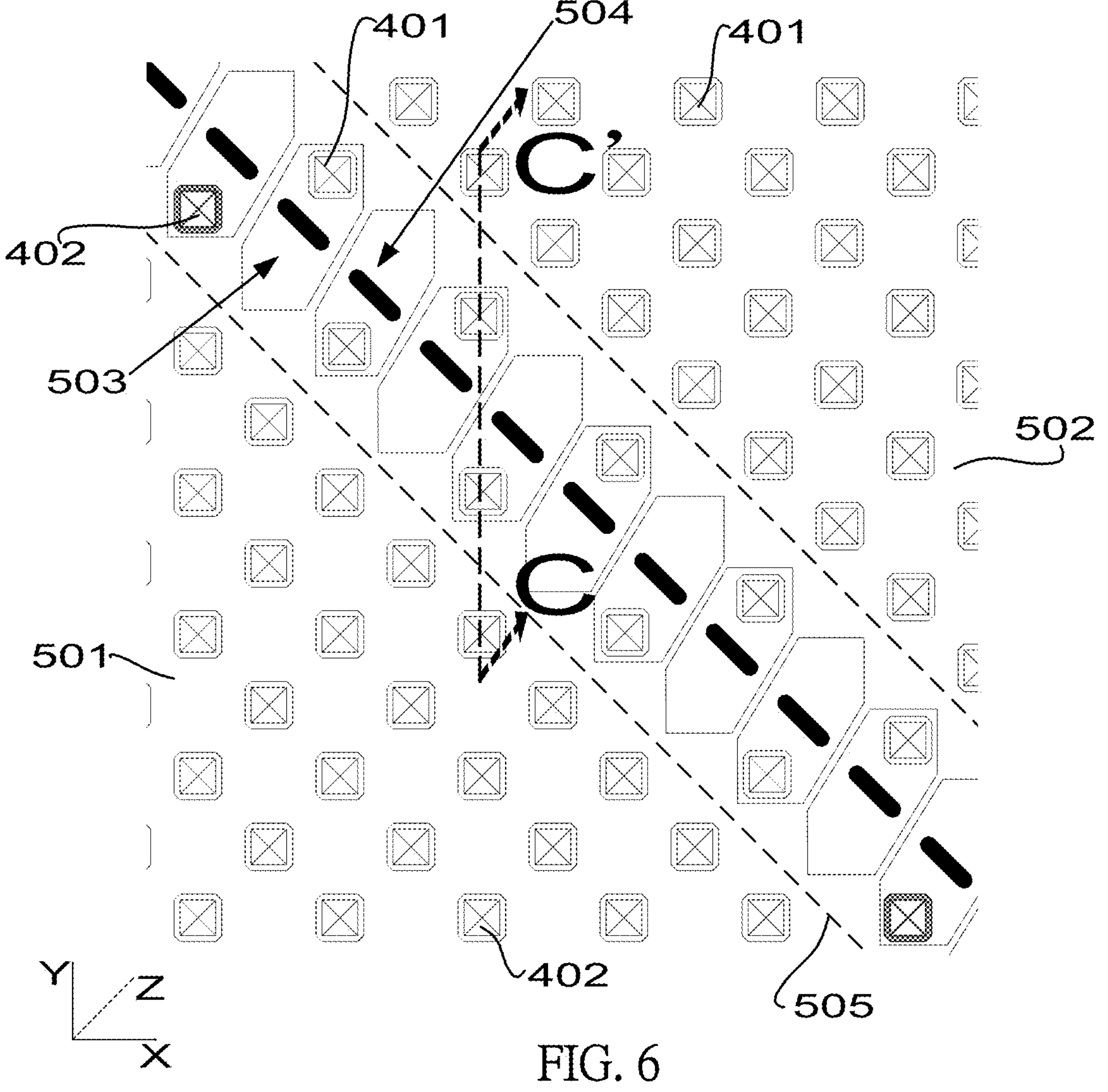
FIG. 6 illustrates an enlarged view of a portion of the second conductive routing layer 103 as shown in FIG. 5 that is at a border region 505 in accordance with an embodiment of the present disclosure.
Figure 7:
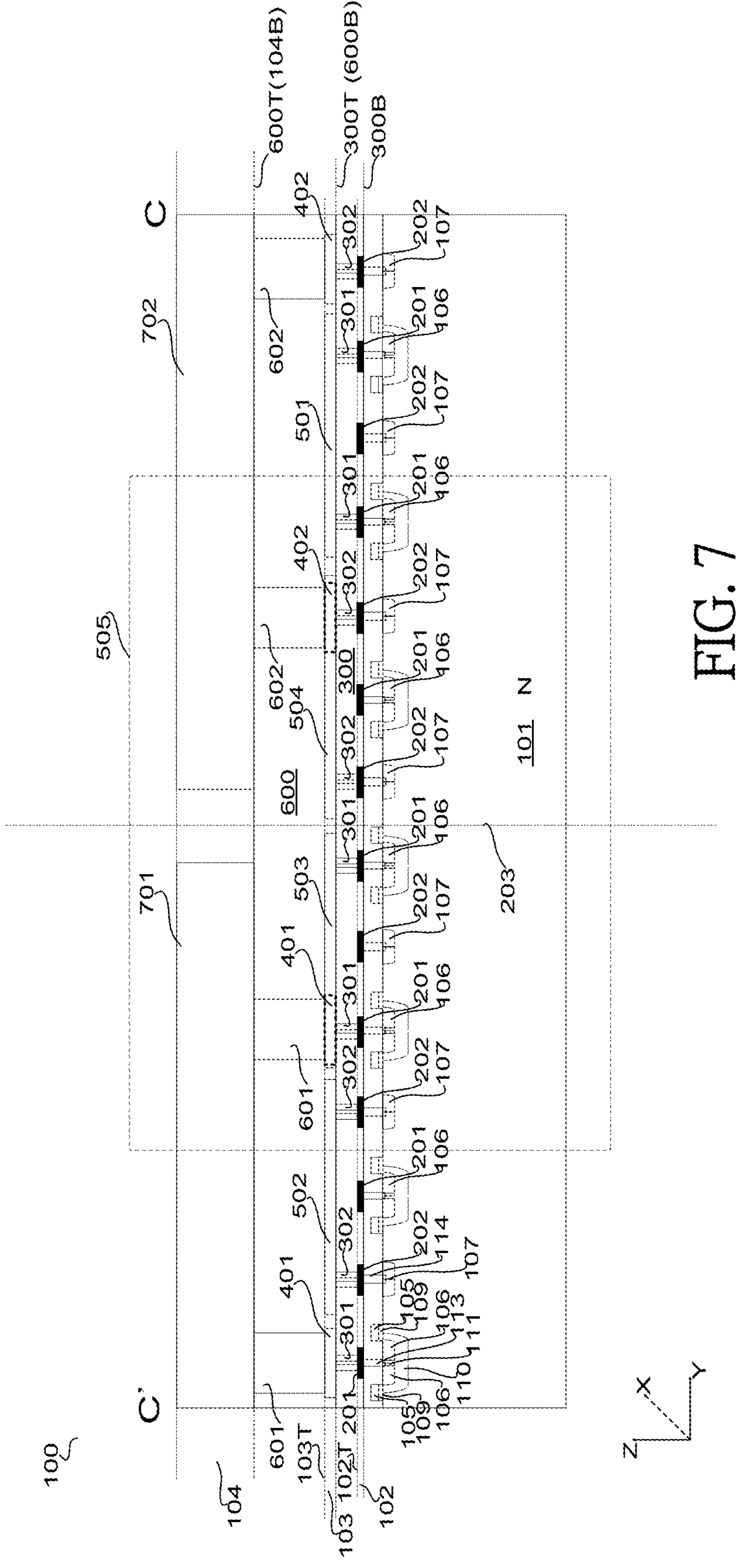
FIG. 7 illustrates a cross-sectional view of the semiconductor device 100 in a Y-Z plane along a CC' line in accordance with an embodiment of the present disclosure.
Figure 8A:
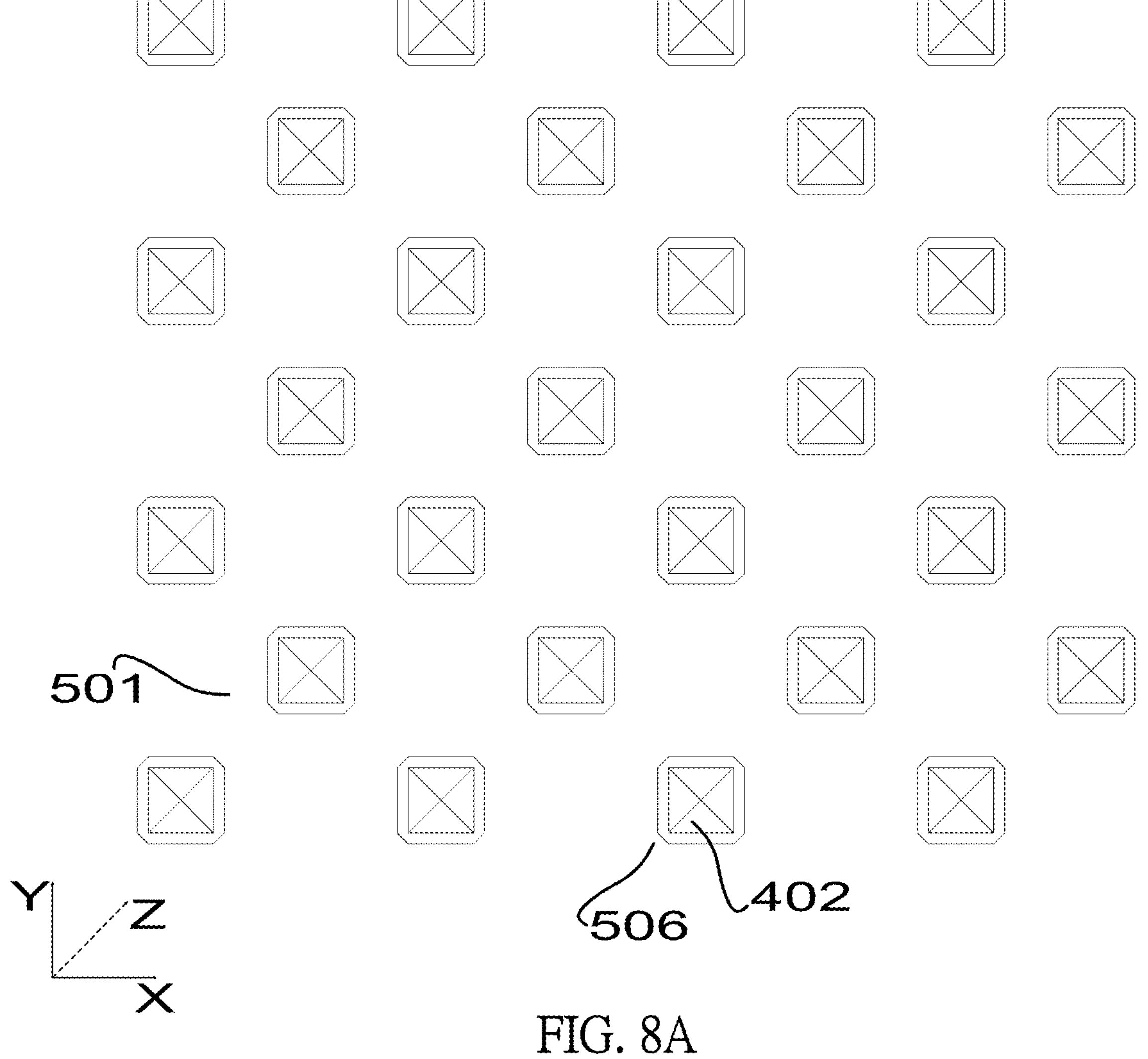
FIG. 8A illustrates an enlarged view of a portion of the second conductive routing layer 103 as shown in FIG. 5 that is in the predetermined second region in accordance with an embodiment of the present disclosure.
Figure 8B:
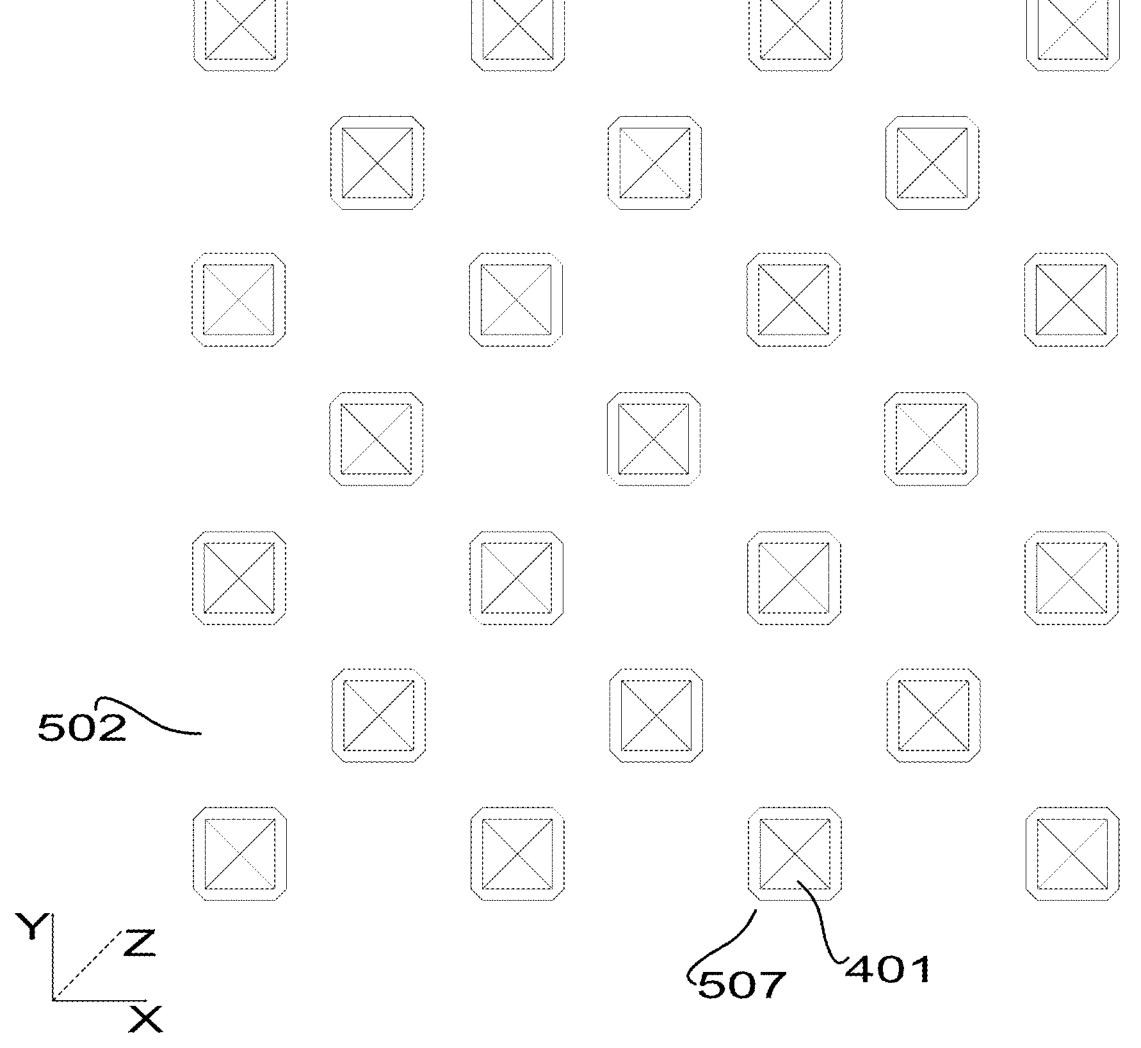
FIG. 8B illustrates an enlarged view of a portion of the second conductive routing layer 103 as shown in FIG. 5 that is in the predetermined first region in accordance with an embodiment of the present disclosure.

For the purpose of better understanding the embodiments of the present disclosure, FIG. 6 illustrates an enlarged view of a portion of the second conductive routing layer 103 as shown in FIG. 5 that is at the border region 505 in accordance with an embodiment of the present disclosure. FIG. 7 illustrates a cross-sectional view of the semiconductor device 100 in a Y-Z plane along a CC' line in accordance with an embodiment of the present disclosure. FIG. 8A illustrates an enlarged view of a portion of the second conductive routing layer 103 as shown in FIG. 5 that is in the predetermined second region in accordance with an embodiment of the present disclosure. FIG. 8B illustrates an enlarged view of a portion of the second conductive routing layer 103 as shown in FIG. 5 that is in the predetermined first region in accordance with an embodiment of the present disclosure.

It will be understood by persons having ordinary skills in the art that, although in FIGS. 5-6 the first tooth-shaped structures 503 and the second tooth-shaped structures 504 are illustrated as having the shape of a tooth or sword, such shape is merely exemplary, and the present disclosure does not intend to limit the embodiments in this respect. In another embodiment, each of the first tooth-shaped structures 503 and the second tooth-shaped structures 504 may have a shape of rectangle, rhombus, finger, petal, or any other suitable shape. Different shapes may be included and do not go beyond the scope of the present disclosure. In some embodiments, the arrangement and shape of the first tooth-shaped structures 503 and the second tooth-shaped structures 504 described above can reduce the intensity of electric field caused by the voltage difference between the first tooth-shaped structures 503 and the second tooth-shaped structures 504, and thus help the mesh conductive layers 501 and 502 to collect current.

Still with reference to FIGS. 5 and 6, each of the first tooth-shaped structures 503 may be integrated with at least one of the first conductive islands 401. That is, each first tooth-shaped structure 503 and at least one of the first conductive islands 401 may combine together to form an entirety with no separation. Because the first tooth-shaped structures 503 are part of the first mesh conductive layer 501, the first conductive islands 401 can also be described as being integrated with the first mesh conductive layer 501. Please refer to FIG. 7 for better understanding. In FIG. 7, a dashed rectangle on the cross section of the first tooth-shaped structure 503 indicates the at least one first conductive island 401 that is integrated with the first tooth-shaped structure 503. Accordingly, the at least one first conductive island 401 integrated with the first tooth-shaped structure 503 may actually be a portion of the first tooth-shaped structure 503. Such portion may be connected to the at least one first vias 301 below and thus may be electrically coupled to at least one of the first conductive buses 201. It will be understood by persons having ordinary skills in the art that such configuration is merely exemplary. In another embodiment, according to actual application and design needs, each of the first tooth-shaped structures 503 may be integrated with more than one first conductive islands 401.

Still with reference to FIGS. 5 and 6, each of the second tooth-shaped structures 504 may be integrated with at least one of the second conductive islands 402. That is, each second tooth-shaped structure 504 and at least one of the second conductive islands 402 may combine together to form an entirety with no separation. Because the second tooth-shaped structures 504 are part of the second mesh conductive layer 502, the second conductive islands 402 can also be described as being integrated with the second mesh conductive layer 502. Please refer to FIG. 7 for better understanding. In FIG. 7, a dashed rectangle on the cross section of the second tooth-shaped structure 504 indicates the at least one second conductive island 402 that is integrated with the second tooth-shaped structure 504. Accordingly, the at least one second conductive island 402 integrated with the second tooth-shaped structure 504 may actually be a portion of the second tooth-shaped structure 504. Such portion may be connected to the at least one second vias 302 below and thus may be electrically coupled to at least one of the second conductive buses 202. It will be understood by persons having ordinary skills in the art that such configuration is merely exemplary. In another embodiment, according to actual application and design needs, each of the second tooth-shaped structure 504 may be integrated with more than one second conductive island 402.

Still with reference to FIG. 5, in one embodiment, the first mesh conductive layer 501 may envelop the second conductive islands 402 that are not integrated with the second tooth-shaped structures 504. The second conductive islands 402 that are not integrated with the second tooth-shaped structures 504 or the second mesh conductive layer 502 are referred to as the unintegrated second conductive islands 402 or the remaining second conductive islands 402 below. The first mesh conductive layer 501 may be separated and/or electrically isolated from each of the unintegrated second conductive islands 402. For example, there may be small gaps between the first mesh conductive layer 501 and each of the second conductive islands 402, and the gaps may be filled with dielectric or electrical insulation materials. In some embodiments, the first mesh conductive layer 501 may have openings 506, and each opening 506 may correspond to one of the unintegrated second conductive islands 402. Each of the unintegrated second conductive islands 402 may be arranged in the corresponding opening 506, like a small island independent of the first mesh conductive layer 501. In one embodiment, each opening 506 may have the same shape as the shape of its corresponding second conductive island 402, and the size of the opening 506 may be larger than the size of the second conductive island 402. Please refer to FIG. 8A for better understanding.

Please refer to FIGS. 5 and 3B. In one embodiment, the first mesh conductive layer 501 may be, in the Z-axis direction, electrically coupled to the first conductive buses 201 in the first routing layer 102 through the first vias 301 (and the conductive materials within the first vias 301) arranged in the predetermined second region. The unintegrated second conductive islands 402 arranged in the openings 506 distributed in the first mesh conductive layer 501 may be, in the Z-axis direction, electrically coupled to the second conductive buses 202 through the second vias 302 (and the conductive materials within the second vias 302). Accordingly, in actual applications, the first mesh conductive layer 501 and the unintegrated second conductive islands 402 may be configured to couple to and transmit different voltages. For example, in the embodiment where the first conductive buses 201 are configured to couple to and transmit the first voltage and the second conductive buses 202 are configured to couple to and transmit the second voltage, the first mesh conductive layer 501 may be configured to couple to and transmit the first voltage, and the unintegrated second conductive islands 402 may be configured to couple to and transmit the second voltage. In the embodiment where the semiconductor device 100 includes the high-power switching unit such as a DMOS FET, in actual applications, the first mesh conductive layer 501 may be configured to couple to and transmit the source voltage of the DMOS FET, and the unintegrated second conductive islands 402 may be configured to couple to and transmit the drain voltage of the DMOS FET.

Still with reference to FIG. 5, in one embodiment, the second mesh conductive layer 502 may envelop the first conductive islands 401 that are not integrated with the first tooth-shaped structures 503 at the border region 505. The first conductive islands 401 that are not integrated with the first tooth-shaped structures 503 are referred to as the unintegrated first conductive islands 401 or the remaining first conductive islands 401 below. The second mesh conductive layer 502 may be separated and/or electrically isolated from each of the unintegrated first conductive islands 401. For example, there may be small gaps between the second mesh conductive layer 502 and each of the first conductive islands 401, and the gaps may be filled with dielectric or electrical insulation materials. In some embodiments, the second mesh conductive layer 502 may have openings 507, and each opening 507 may correspond to one of the unintegrated first conductive islands 401. Each of the unintegrated first conductive islands 401 may be arranged in the corresponding opening 507, like a small island independent of the second mesh conductive layer 502. In one embodiment, each opening 507 may have the same shape as the shape of its corresponding first conductive island 401, and the size of the opening 507 may be larger than the size of the first conductive island 401. Please refer to FIG. 8A for better understanding.

Please refer to FIGS. 5 and 3A. In one embodiment, the second mesh conductive layer 502 may be, in the Z-axis direction, electrically coupled to the second conductive buses 202 in the first routing layer 102 through the second vias 302 (and the conductive materials within the second vias 302) arranged in the predetermined first region. The unintegrated first conductive islands 401 arranged in the openings 507 distributed in the second mesh conductive layer 502 may be, in the Z-axis direction, electrically coupled to the first conductive buses 201 through the first vias 301 (and the conductive materials within the first vias 301). Accordingly, in actual applications, the second mesh conductive layer 502 and the unintegrated first conductive islands 401 may be configured to couple to and transmit different voltages. For example, in the embodiment where the first conductive buses 201 are configured to couple to and transmit the first voltage and the second conductive buses 202 are configured to couple to and transmit the second voltage, the second mesh conductive layer 502 may be configured to couple to and transmit the second voltage, and the unintegrated first conductive islands 401 may be configured to couple to and transmit the first voltage. In the embodiment where the semiconductor device 100 includes the high-power switching unit such as a DMOS FET, in actual applications, the second mesh conductive layer 502 may be configured to couple to and transmit the drain voltage of the DMOS FET, and the unintegrated first conductive islands 401 may be configured to couple to and transmit the source voltage of the DMOS FET.

Due to the mesh conductive layers 501 and 502 and the unintegrated vias 401 and 402 described above, the semiconductor device 100 can use the area of the second conductive routing layer 103 efficiently, evenly distribute the current paths transmitting the first and second voltages (i.e., the paths transmitting the currents corresponding to the first and second voltages), reduce the wiring or routing resistance of the current paths, and has better capability of collecting and processing currents.

Figure 9:
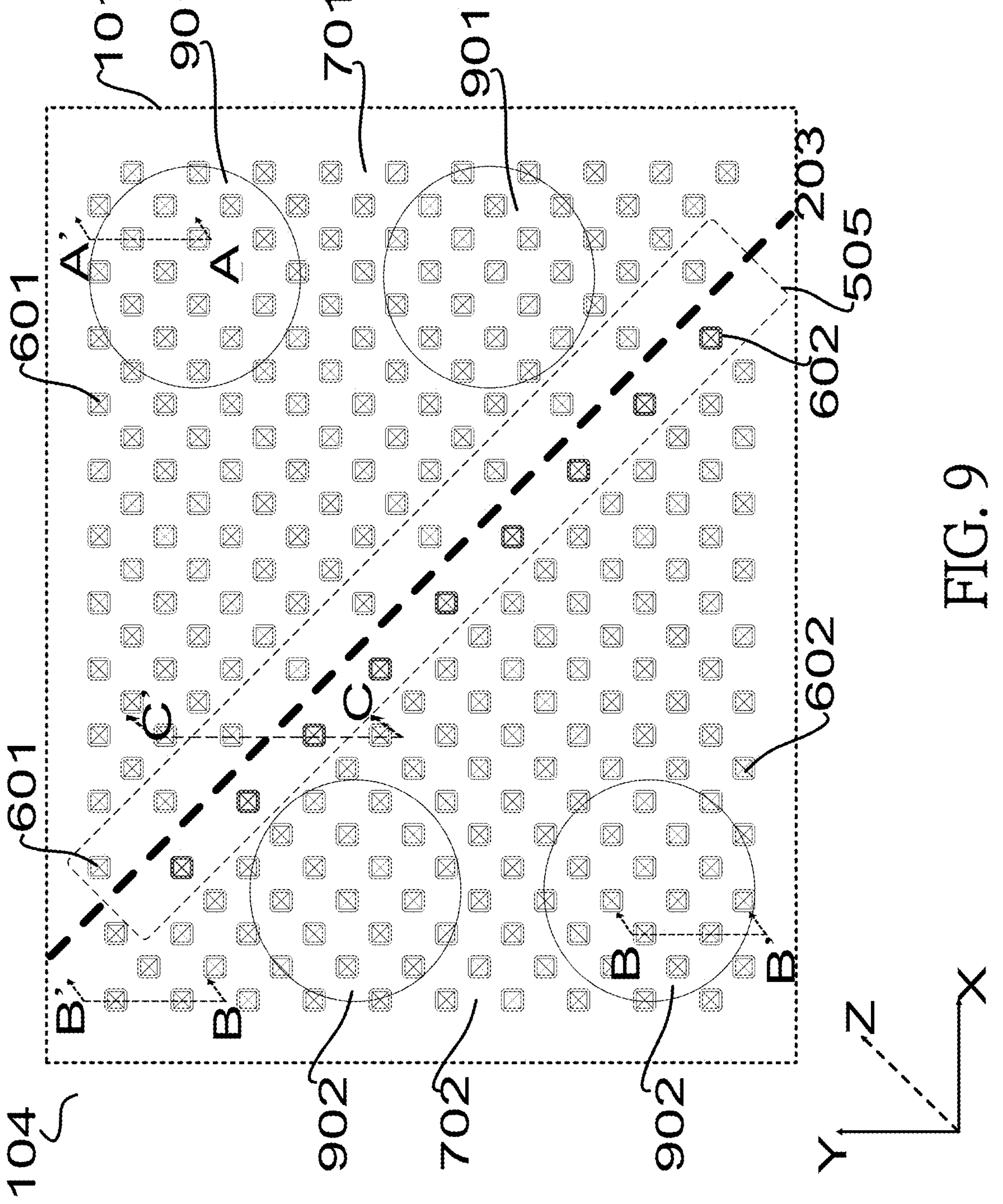
FIG. 9 illustrates a top view of a third conductive routing layer of the semiconductor device 100 in an X-Y plane in accordance with an embodiment of the present disclosure.

In one embodiment, in the Z-axis direction, a second inter-layer dielectric layer 600 may be formed on the second conductive routing layer 103, and the third conductive routing layer 104 may be formed on the second inter-layer dielectric layer 600. Please refer to FIGS. 3A-3B, 7, and 9. FIG. 9 illustrates a top view of the third conductive routing layer 104 of the semiconductor device 100 in the X-Y plane in accordance with an embodiment of the present disclosure.

Third vias 601 and fourth vias 602 may be formed in the second inter-layer dielectric layer 600. Each of the third vias 601 and the fourth vias 602 may extend through and cross the second inter-layer dielectric layer 600 and may be configured to provide paths for electrical coupling and connection between the second conductive routing layer 103 and the third conductive layer 104. In one embodiment, each of the third vias 601 and the fourth vias 602 may be filled with conductive materials such as W, Co, Ni, Cu, etc. and any combination or alloy thereof. In some embodiments, the third conductive routing layer 104 may include a third conductive layer 701 formed in the predetermined first region (i.e., the region at the right side of the dividing line 203 in FIG. 9) and a fourth conductive layer 702 formed in the predetermined second region (i.e., the region at the left side of the dividing line 203 in FIG. 9). The third conductive layer 701 and the fourth conductive layer 702 may be electrically isolated from each other. In one embodiment, the third conductive layer 701 may be a single piece of conductive material layer arranged in the predetermined first region, and the fourth conductive layer 702 may be a single piece of conductive material layer arranged in the predetermined second region. In one embodiment, as shown in FIG. 7, the third conductive layer 701 may directly contact the third vias 601 (and the conductive materials within the third vias 601) at a top surface 600T of the second inter-layer dielectric layer 600, and the fourth conductive layer 702 may directly contact the fourth vias 602 (and the conductive materials within the fourth vias 602) at the top surface 600T of the second inter-layer dielectric layer 600.

In one embodiment, the third vias 601 may correspond to the first conductive islands 401 formed in the second conductive routing layer 103 (including the first conductive islands 401 integrated with the first tooth-shaped structures 503 and the unintegrated first conductive islands 401) in a one-to-one correspondence manner. That is, the third vias 601 may be formed in the second inter-layer dielectric layer 600 corresponding to the first conductive islands 401. In FIG. 9, the cross sections of the third vias 601 in the X-Y plane (or the cross sections on a bottom surface 104B of the third routing layer 104 or on the top surface 600T of the second inter-layer dielectric layer 600) are illustrated as the small squares filled with grids. In one embodiment, the one-to-one correspondence between the third vias 601 and the first conductive islands 401 may indicate that the cross sections or projections of the third vias 601 and the corresponding first conductive islands 401 on the plane of the bottom surface 600B of the second inter-layer dielectric layer 600 may be overlapped. Accordingly, the third vias 601 and the corresponding first conductive islands 401 may directly contact each other. That is, each third via 601 may vertically extend from a top surface 600T of the second inter-layer dielectric layer 600, through the second inter-layer dielectric layer 600, to reach and directly contact the corresponding first conductive island 401. In one embodiment, the one-to-one correspondence between the third vias 601 and the first conductive islands 401 may further indicate that the shapes of the cross sections or projections of the third vias 601 and the corresponding first conductive islands 401 in the plane of the top surface 103T of the second conductive routing layer 103 or the bottom surface 600B of the second inter-layer dielectric layer 600 may match with each other (e.g., the shapes are the same). Please refer to FIGS. 5, 3A-3B, and 7 for better understanding. Each first conductive island 401 may be electrically coupled to the third conductive layer 701 through the corresponding third via 601. Accordingly, the third conductive layer 701 may be electrically coupled to the first conductive islands 401 in the second conductive routing layer 103 through the third vias 601 and may be further electrically coupled to the first conductive buses 201 through the first vias 301.

In one embodiment, the fourth vias 602 may correspond to the second conductive islands 402 formed in the second conductive routing layer 103 (including the second conductive islands 402 integrated with the first tooth-shaped structures 503 and the unintegrated second conductive islands 402) in a one-to-one correspondence manner. That is, the fourth vias 602 may be formed in the second inter-layer dielectric layer 600 corresponding to the second conductive islands 402. In FIG. 9, the cross sections of the fourth vias 602 in the X-Y plane (or the cross sections on a bottom surface 1046 of the third routing layer 104 or on the top surface 600T of the second inter-layer dielectric layer 600) are illustrated as the small squares filled with dots. In one embodiment, the one-to-one correspondence between the fourth vias 602 and the second conductive islands 402 may indicate that the cross sections or projections of the fourth vias 602 and the corresponding second conductive islands 402 on the plane of the bottom surface 600B of the second inter-layer dielectric layer 600 may be overlapped. Accordingly, the fourth vias 602 and the corresponding second conductive islands 402 may directly contact each other. That is, each fourth via 602 may vertically extend from the top surface 600T of the second inter-layer dielectric layer 600, through the second inter-layer dielectric layer 600, to reach and directly contact the corresponding second conductive island 402. In one embodiment, the one-to-one correspondence between the fourth vias 602 and the second conductive islands 402 may further indicate that the shapes of the cross sections or projections of the fourth vias 602 and the corresponding second conductive islands 402 in the plane of the bottom surface 600B of the second inter-layer dielectric layer 600 may match with each other (e.g., the shapes are the same). Each second conductive island 402 may be electrically coupled to the fourth conductive layer 702 through the corresponding fourth via 602. Accordingly, the fourth conductive layer 702 may be electrically coupled to the second conductive islands 402 in the second conductive routing layer 103 through the fourth vias 602 and may be further electrically coupled to the second conductive buses 202 through the second vias 302.

Accordingly, in actual applications, the third conductive layer 701 and the fourth conductive layer 702 may be configured to couple to and transmit different voltages. For example, in the embodiment where the first conductive buses 201 are configured to couple to and transmit the first voltage and the second conductive buses 202 are configured to couple to and transmit the second voltage, the third conductive layer 701 may be configured to couple to and transmit the first voltage, and the fourth conductive layer 702 may be configured to couple to and transmit the second voltage. In the embodiment where the semiconductor device 100 includes the high-power switching unit such as a DMOS FET, in actual applications, the third conductive layer 701 may be configured to couple to and transmit the source voltage of the DMOS FET, and the fourth conductive layer 702 may be configured to couple to and transmit the drain voltage of the DMOS FET.

In one embodiment, the thickness T3 of the third conductive routing layer 104 (including the third conductive layer 701 and the fourth conductive layer 702) may be larger than the thickness T2 of the second conductive routing layer 103 (including the first mesh conductive layer 501, the second mesh conductive layer 502, the first conductive islands 401, and the second conductive islands 402). That is, T3>T2. In one embodiment, the thickness T3 of the third conductive routing layer 104 may be 1.5~8 times the thickness T2 of the second conductive routing layer 103. In one embodiment, the thickness T2 of the second conductive routing layer 103 may be larger than or equal to the thickness T1 of the first conductive routing layer 102 (including the first lines 201 and the second lines 202). That is, T2≥T1. In one embodiment, the third conductive routing layer 104 may include Al, and the thickness T3 may be between 0.8~4 μm. In one embodiment, the third conductive routing layer 104 may include Cu, and the thickness T3 may be between 2~3 μm. In one embodiment, the second conductive routing layer 103 may include Al, and the thickness T2 may be between 0.4~0.8 μm. In one embodiment, the second conductive routing layer 103 may include Cu, and the thickness T2 may be between 0.2~0.4 μm. In one embodiment, the first conductive routing layer 102 may include Al, and the thickness T1 may be between 0.4~0.5 μm. In one embodiment, the first conductive routing layer 102 may include Cu, and the thickness T1 may be between 0.2~0.3 μm. The thicknesses mentioned above refer to the measurements of the layers in the Z-axis direction. It will be understood by persons having ordinary skills in the art that the at least one conductive routing layer (e.g., the first conductive routing layer 102, the second conductive routing layer 103, and the third conductive routing layer 104) may include other metal or conductive materials that has better conductivity than Al or Cu. The present disclosure does not intend to limit the embodiments in this respect.

Still with reference to FIG. 9, in one embodiment, the semiconductor device 100 may further include conductive bumps formed on the third conductive routing layer 104. For example, at least one first conductive bump 901 may be formed on the third conductive layer 701, and at least one second conductive bump 902 may be formed on the fourth conductive layer 702. The first conductive bump 901 may contact and be electrically coupled to the third conductive layer 701. The second conductive bump 902 may contact and be electrically coupled to the fourth conductive layer 702. In the exemplary embodiment of FIG. 9, the conductive bumps (e.g., the first conductive bumps 901 and the second conductive bumps 902) are illustrated as the circles filled with oblique lines. It will be understood by persons having ordinary skills in the art that the shape and illustration of the conductive bumps are merely exemplary. The present disclosure does not intend to limit the embodiments in this respect. The conductive bumps may be configured to electrically couple the third conductive routing layer 104 to the lead frame or routing board of the semiconductor device 100 or a printed circuit board ("PCB"), so that the semiconductor device 100 may be electrically coupled to other circuit to exchange signals with such circuit.

Below describes the embodiment where the semiconductor device 100 includes the high-power switching unit such as a DMOS FET with reference to FIGS. 3A-3B and 7. In some embodiments, multiple DMOS cells may be formed in the substrate 101 to form an array of DMOS cells. Each DMOS cell may include a source region 106, a drain region 107, and a gate region 108. Each gate region 108 may include a gate conductive structure 105 and a gate dielectric structure 109 that may be formed between the gate conductive structure 105 and the substrate 101. Accordingly, in the X-Y plane, the gate region 108 of each DMOS cell may surround a corresponding first conductive bus 201, as shown in FIG. 2B. In some embodiments, the source region 106 and the drain region 107 may have the same first conductive or doping type (e.g., N type in the embodiments of FIGS. 3A-3B). The substrate 101 may have the first doping type, and its doping concentration may be lower than the one of the source region 106 and the drain region 107. In some embodiments, each DMOS cell may further include a bulk region 110 that may surround the source region 106. The bulk region 110 may have a second conductive or doping type (e.g., P type in the embodiments of FIGS. 3A-3B) different from the type of the source region 106. The bulk region 110 may separate the source region 106 and the substrate 101. In some embodiments, each DMOS cell further may include a bulk contact region 111 that has the same second conductive or doping type (e.g., P type in the embodiments FIGS. 3A-3B) as the bulk region 110. The doping concentration of the bulk contact region 111 may be higher than the concentration of bulk region 110 and may be configured to reduce the contact resistance between the bulk region 110 and the routing structures above. A third inter-layer dielectric layer 112 may be formed between the first conductive routing layer 102 and the substrate 101. In some embodiments, the source region 106 of each DMOS cell may be electrically coupled to one of the first conductive buses 201 through a source contact via 113 (and the conductive materials within the source contact via 113) that may be formed in the third inter-layer dielectric layer 112. In some embodiments, the drain region 107 of each DMOS cell may be electrically coupled to one of the second conductive buses 202 through a drain contact via 114 (and the conductive materials within the drain contact via 114) that may be formed in the third inter-layer dielectric layer 112. Thus, the source regions 106 of all the DMOS cells may be electrically coupled to the third conductive layer 701 and the first conductive bumps 901 through the routing layers described in the embodiments of FIGS. 2A-9 (e.g. routing layers 102, 103, and 104), and the drain regions 107 of all the DMOS cells may be electrically coupled to the fourth conductive layer 702 and the second conductive bumps 902 through the routing layers described in the embodiments of FIGS. 2A-9 (e.g. routing layers 102, 103, and 104)

In actual applications, the first voltage (or the source voltage) and the second voltage (or the drain voltage) may be electrically coupled to and transmitted to all the source regions 106 and the drain regions 107 of the high-power switching unit (e.g., DMOS FET) through the wiring or routing structure or the at least one conductive routing layer formed on the substrate 101. When the high-power switching unit (e.g., N-channel DMOS FET) is turned on (i.e., when the voltage difference between the gate region 108 and the source region 106 of the N-channel DMOS is larger than the threshold voltage of the N-channel DMOS), because the drain region 107 and the source region 106 of each DMOS cell may be respectively coupled to the second voltage and the first voltage (the second voltage is higher than the first voltage in the embodiment of N-channel DMOS), a current may flow from the drain region 107 of the DMOS cell to the source region 106 of the DMOS cell through the channel of the DMOS cell. Such current is hereinafter referred to as a DMOS cell current.

In one embodiment, corresponding to the transmission path of the second voltage (or the drain voltage), the DMOS cell current of each DMOS cell may be coupled to and transmitted to the second conductive buses 202 through the drain region 107. Then, in the predetermined second region, the current may be transmitted to and collected by the second mesh conductive layer 502 through the second vias 302. Meanwhile, in the predetermined first region, the current may be transmitted to and collected by the second conductive islands 402 through the second vias 302. In one embodiment, with reference to FIG. 7, the current collected by the second mesh conductive layer 502 may be further coupled to and transmitted to the fourth conductive layer 702 through the second tooth-shaped structures 504 and the fourth vias 602 formed on the second tooth-shaped structures 504 (i.e., the fourth vias 602 corresponding to the second conductive islands 402 integrated with the second tooth-shaped structures 504). In one embodiment, with reference to FIG. 7, the current collected by the second conductive islands 402 may be further coupled to and transmitted to the fourth conductive layer 702 through the fourth vias 602 corresponding to the second conductive islands 402.

Similarly, corresponding to the transmission path of the first voltage (or the source voltage), the DMOS cell current of each DMOS cell may be coupled to and transmitted to the first conductive buses 201 through the source region 106. Then, in the predetermined first region, the current may be transmitted to and collected by the first mesh conductive layer 501 through the first vias 301. Meanwhile, in the predetermined second region, the current may be transmitted to and collected by the first conductive islands 401 through the first vias 301. In one embodiment, with reference to FIG. 7, the current collected by the first mesh conductive layer 501 may be further coupled to and transmitted to the third conductive layer 701 through the first tooth-shaped structures 503 and the third vias 601 formed on the first tooth-shaped structures 503 (i.e., the f third vias 601 corresponding to the first conductive islands 401 integrated with the first tooth-shaped structures 503). In one embodiment, with reference to FIG. 7, the current collected by the first conductive islands 401 may be further coupled to and transmitted to the third conductive layer 701 through the third vias 601 corresponding to the first conductive islands 401.

It will be understood by persons having ordinary skills in the art that the semiconductor device 100 and the routing structure for the semiconductor device 100 described above are merely exemplary. In one embodiment, the routing structure may include intermediate conductive routing layer(s), e.g., the second conductive routing layer 103. In one embodiment, the routing structure may further include lower conductive routing layer(s), e.g., the first conductive routing layer 102, and/or upper conductive routing layer(s), e.g., the third conductive routing layer 104. It will be understood by persons having ordinary skills in the art that the numbers of the conductive routing layers in the routing structure described in previous embodiments may be determined and modified according to actual needs of electrical connection and routing. The present disclosure does not intend to limit the embodiments in this respect. For example, in another embodiment, the routing structure for the semiconductor device may include any combination of intermediate conductive routing layer(s) (e.g., the second conductive routing layer 103), lower conductive routing layer(s) (e.g., the first conductive routing layer 102), and upper conductive routing layer(s) (e.g., the third conductive routing layer 104). For example, the routing structure may include multiple lower conductive routing layers (e.g., 2 or 3 layers) or multiple intermediate conductive routing layers (e.g., 2 or 3 layers). In some embodiments, an inter-layer dielectric layer may be formed between any two adjacent layers in the routing structure, and the adjacent layers may be electrically coupled to each other through vias formed in the inter-layer dielectric layer.

Figure 10A:
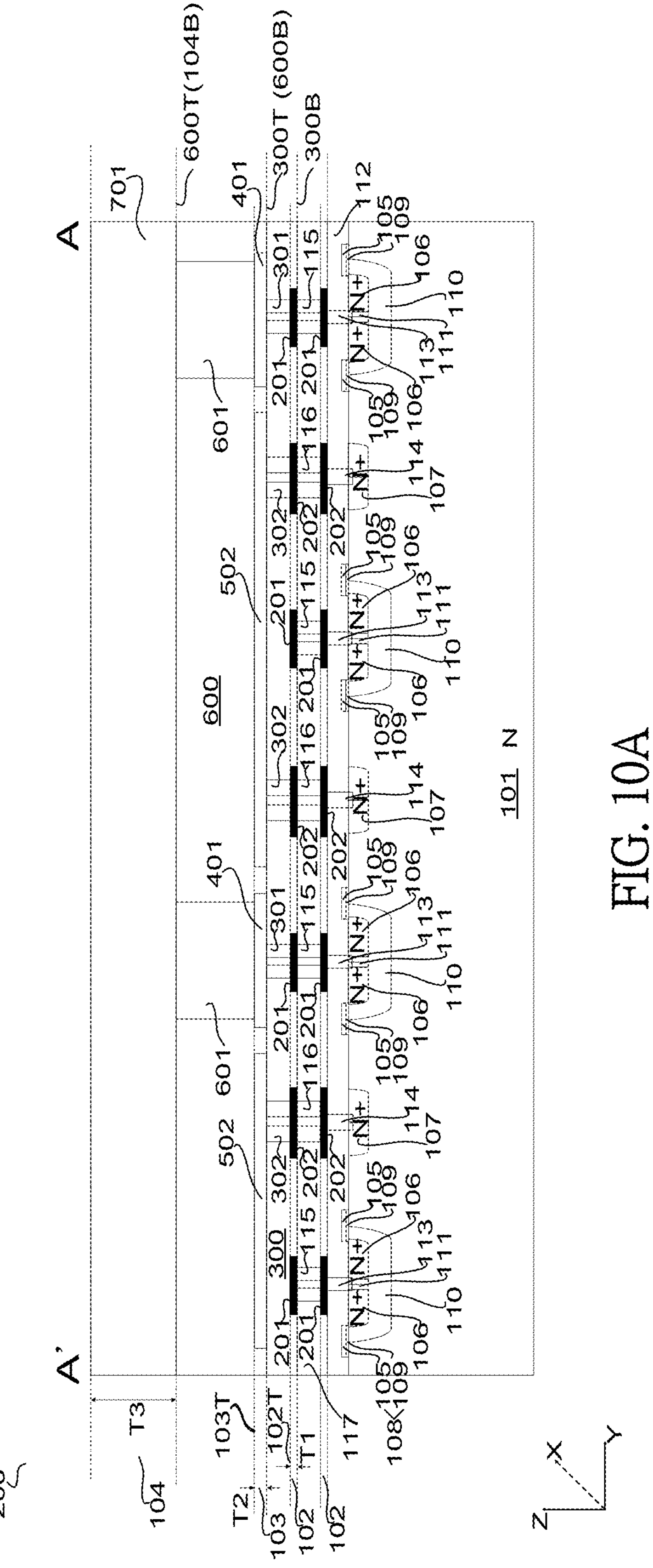
FIGS. 10A, 10B, and 10C respectively illustrate cross-sectional views of a semiconductor device 200 in a Y-Z plane along an AA' line, a BB' line, and a CC' line in accordance with an embodiment of the present disclosure.
Figure 10B:
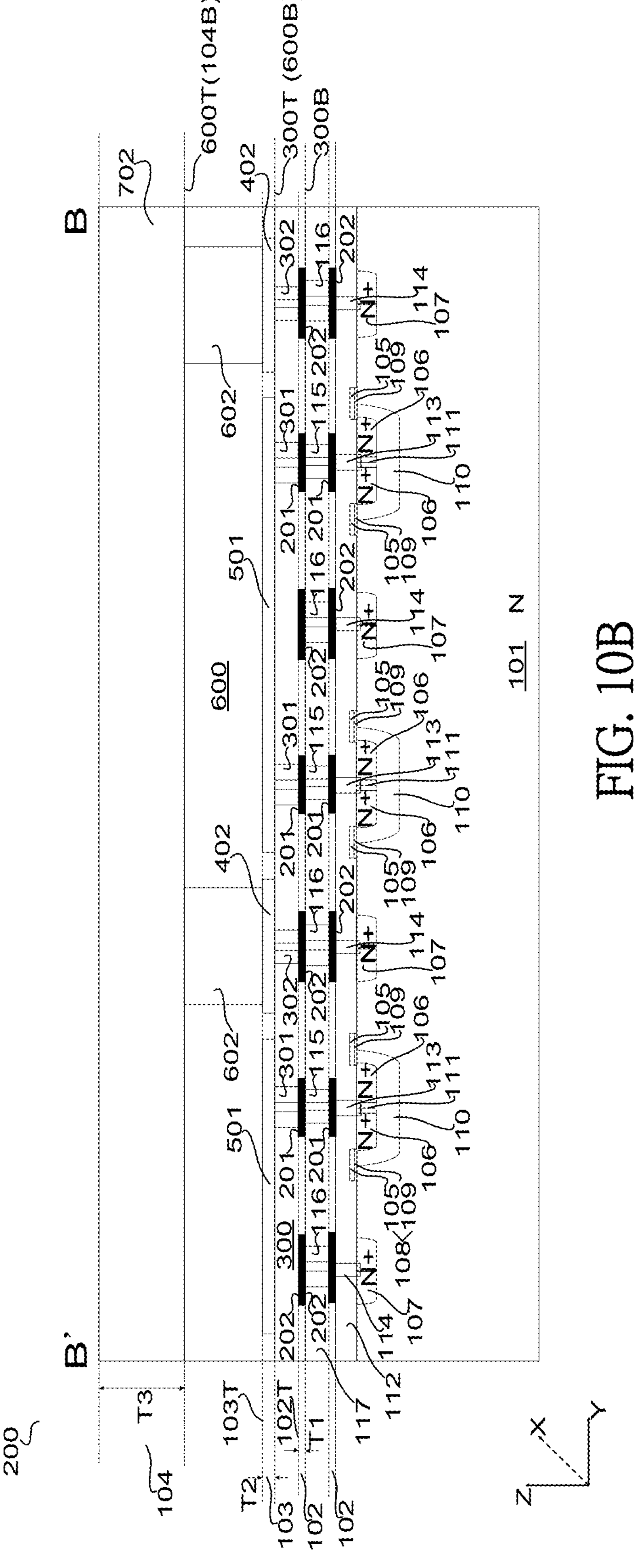
Figure 10C:
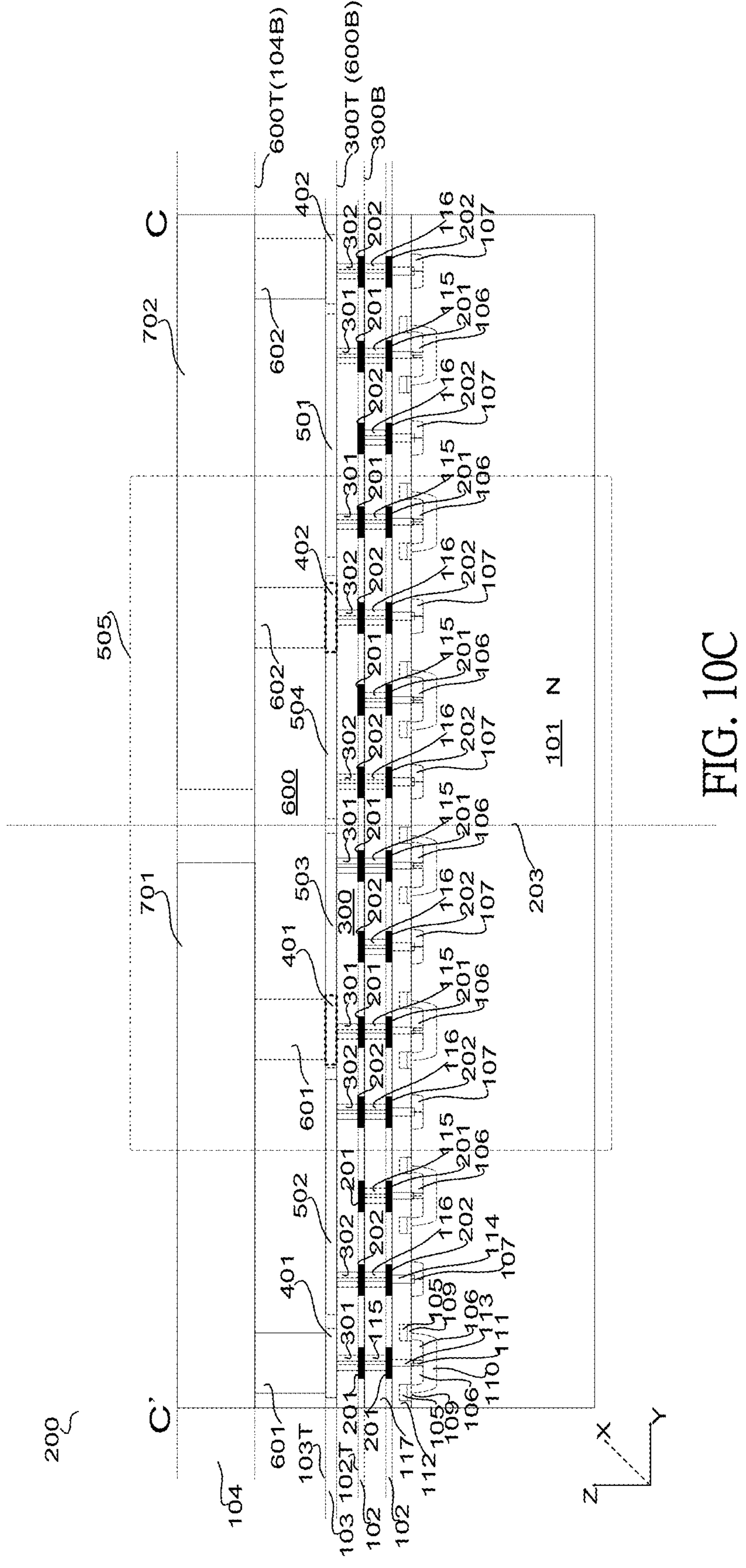

FIGS. 10A, 10B, and 10C respectively illustrate cross-sectional views of a semiconductor device 200 in a Y-Z plane along an AA' line, a BB' line, and a CC' line in accordance with an embodiment of the present disclosure. Different from the semiconductor device 100, the semiconductor device 200 may include more than one lower conductive routing layer. In the embodiments of FIGS. 10A, 10B, and 10C, the semiconductor device 200 may include two lower conductive routing layers (i.e., two first conductive routing layers 102) that are adjacent to each other in the Z-axis direction. A fourth inter-layer dielectric layer 117 may be formed between the two first conductive routing layers 102, and multiple fifth vias 115 and sixth vias 116 may be formed in the fourth inter-layer dielectric layer 117 and may be configured to electrically couple the two first conductive routing layers 102. For example, the corresponding first lines 201 in the two first conductive routing layers 102 may be electrically coupled through the fifth vias 115, and the corresponding second lines 202 in the two first conductive routing layers 102 may be electrically coupled through the sixth vias 116. It will be understood by persons having ordinary skills in the art that the descriptions above for the embodiments of FIGS. 1-9 can be referred to in understanding the embodiments of FIGS. 10A-10C. Specifically, the descriptions of the structures, shapes, arrangements, etc. of the conductive routing layers 102-104 can be referred to. In addition, the descriptions of electrical coupling and connection in the Z-axis direction between the intermediate conductive routing layer 103 and the lower conductive routing layer 102 and between the intermediate conductive routing layer 103 and the upper conductive routing layer 104 are applicable to the embodiments of FIGS. 10A-10C. Although details of the semiconductor device 200 are not described here, persons having ordinary skills in the art are able to fully understand the embodiments of FIGS. 10A-10C through the descriptions above combined with FIGS. 1-9.

Figure 11A:
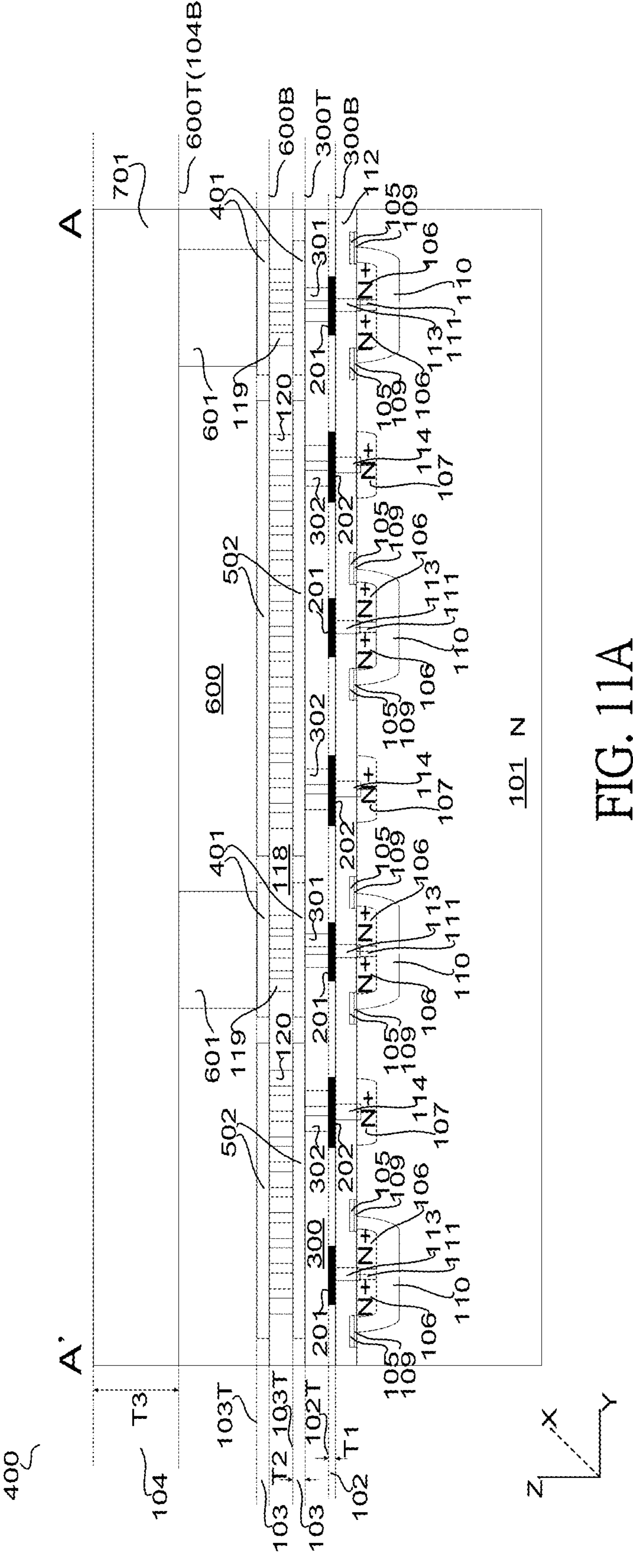
FIGS. 11A, 11B, and 11C respectively illustrate cross-sectional views of a semiconductor device 400 in a Y-Z plane along an AA' line, a BB' line, and a CC' line in accordance with an embodiment of the present disclosure.
Figure 11B:
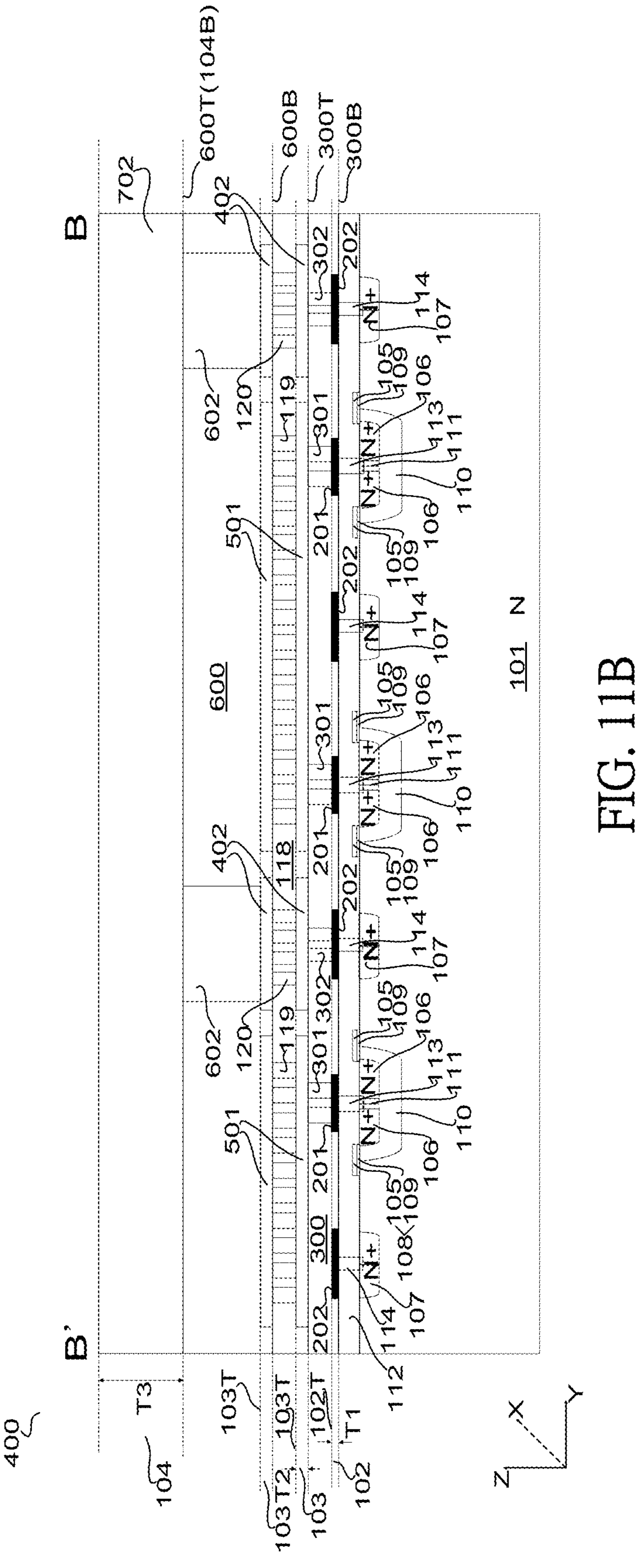
Figure 11C:
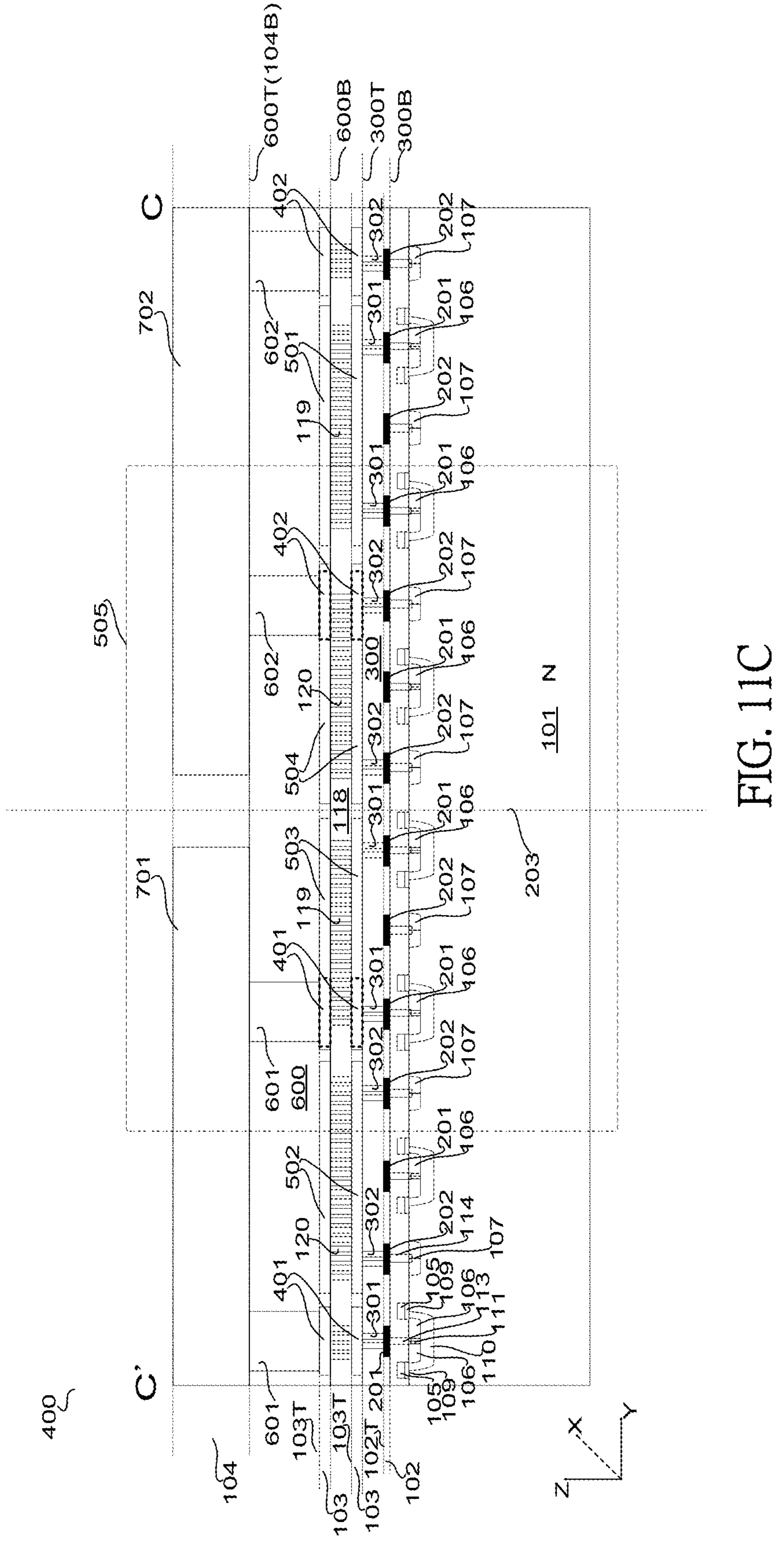

FIGS. 11A, 11B, and 11C respectively illustrate cross-sectional views of a semiconductor device 400 in a Y-Z plane along an AA' line, a BB' line, and a CC' line in accordance with an embodiment of the present disclosure. Different from the semiconductor device 100, the semiconductor device 400 may include more than one intermediate conductive routing layer. In the embodiments of FIGS. 11A, 11B, and 11C, the semiconductor device 400 may include two intermediate conductive routing layers (i.e., two second conductive routing layers 103) that are adjacent to each other in the Z-axis direction. A fifth inter-layer dielectric layer 118 may be formed between the two second conductive routing layers 103, and multiple seventh vias 119 and eighth vias 120 may be formed in the fifth inter-layer dielectric layer 118 and may be configured to electrically couple the two second conductive routing layers 103. For example, as shown in FIG. 11A, the corresponding second mesh conductive layer 502 in the two second conductive routing layers 103 may be electrically coupled through the eighth vias 120, and the corresponding first conductive islands 401 in the two second conductive routing layers 103 may be electrically coupled through the seventh vias 119. It will be understood by persons having ordinary skills in the art that the descriptions above for the embodiments of FIGS. 1-9 can be referred to in understanding the embodiments of FIGS. 11A-11C. Specifically, the descriptions of the structures, shapes, arrangements, etc. of the conductive routing layers 102-104 can be referred to. In addition, the descriptions of electrical coupling and connection in the Z-axis direction between the intermediate conductive routing layer 103 and the lower conductive routing layer 102 and between the intermediate conductive routing layer 103 and the upper conductive routing layer 104 are applicable to the embodiments of FIGS. 11A-11C. Although details of the semiconductor device 300 are not described here, persons having ordinary skills in the art are able to fully understand the embodiments of FIGS. 11A-11C through the descriptions above combined with FIGS. 1-9.

Various embodiments such as the embodiments of FIGS. 10A-10C and 11A-11C cannot be exhaustively listed but are included in the spirit and scope of the present disclosure.

The present disclosure provides a semiconductor device and a routing structure for the semiconductor device. While various embodiments have been described above to illustrate the semiconductor device and the routing structure, it will be understood that they have been presented by way of example only, and not limitation. Rather, the scope of the present disclosure is defined by the following claims and includes combinations and sub-combinations of the various features described above, as well as variations and modifications thereof, which would occur to persons skilled in the art upon reading the foregoing description.

What is claimed is:

1. A semiconductor device, comprising:

a routing structure, having an intermediate conductive routing layer, wherein the intermediate conductive routing layer includes a first mesh conductive layer formed in a predetermined second region of the semiconductor device and a second mesh conductive layer formed in a predetermined first region of the semiconductor device, and the first mesh conductive layer and the second mesh conductive layer are electrically isolated from each other; and wherein the intermediate conductive routing layer further includes a plurality of first conductive islands formed in the predetermined first region and a plurality of second conductive islands formed in the predetermined second region.

2. The semiconductor device of claim 1, wherein at a border region between the first mesh conductive layer and the second mesh conductive layer, the first mesh conductive layer has a plurality of first tooth-shaped structures extending from the first mesh conductive layer towards the second mesh conductive layer, and the second mesh conductive layer has a plurality of second tooth-shaped structures extending from the second mesh conductive layer towards the first mesh conductive layer.

3. The semiconductor device of claim 2, wherein each one of the plurality of first tooth-shaped structures is integrated or merged with at least one of the plurality of first conductive islands.

4. The semiconductor device of claim 3, wherein the plurality of first conductive islands that are not integrated or merged with the plurality of first tooth-shaped structures are referred to as unintegrated first conductive islands, and wherein the second mesh conductive layer envelops the unintegrated first conductive islands and is electrically isolated from the unintegrated first conductive islands.

5. The semiconductor device of claim 2, wherein each one of the plurality of second tooth-shaped structures is integrated or merged with at least one of the plurality of second conductive islands.

6. The semiconductor device of claim 5, wherein the plurality of second conductive islands that are not integrated or merged with the plurality of second tooth-shaped structures are referred to as unintegrated second conductive islands, and wherein the first mesh conductive layer envelops the unintegrated second conductive islands and is electrically isolated from the unintegrated second conductive islands.

7. The semiconductor device of claim 6, wherein the first mesh conductive layer comprises openings that correspond to the unintegrated second conductive islands in a one-to-one correspondence manner, and each one of the unintegrated second conductive islands is formed within a corresponding one of the openings of the first mesh conductive layer.

8. The semiconductor device of claim 4, wherein the second mesh conductive layer comprises openings that correspond to the unintegrated first conductive islands in a one-to-one correspondence manner, and each one of the unintegrated first conductive islands is formed within a corresponding one of the openings of the second mesh conductive layer.

9. The semiconductor device of claim 1, wherein the plurality of first conductive islands are arranged in multiple rows along a first direction, and the first conductive islands in every two adjacent rows are arranged in a staggered manner along a second direction perpendicular to the first direction, and wherein the second conductive islands are arranged in multiple rows along the first direction, and the second conductive islands in every two adjacent rows are arranged in a staggered manner along the second direction.

10. The semiconductor device of claim 1, wherein the plurality of first conductive islands are arranged in a quincunx pattern, and wherein the plurality of second conductive islands are arranged in a quincunx pattern.

11. The semiconductor device of claim 1, wherein the routing structure further comprises:

a lower conductive routing layer formed below the intermediate conductive routing layer, wherein the lower conductive routing layer comprises a plurality of first conductive buses and a plurality of second conductive buses that extend in a first direction and are arranged in an alternate order along a second direction that is perpendicular to the first direction.

12. The semiconductor device of claim 11, wherein the first mesh conductive layer and at least one of the plurality of first conductive islands are coupled to at least one of the plurality of first conductive buses, and wherein the second mesh conductive layer and at least one of the plurality of second conductive islands are coupled to at least one of the plurality of second conductive buses.

13. The semiconductor device of claim 11, wherein the routing structure further comprises:

a first inter-layer dielectric layer formed between the lower conductive routing layer and the intermediate conductive routing layer; and wherein the first mesh conductive layer and the plurality of first conductive islands are coupled to the plurality of first conductive buses through a plurality of first vias that are formed in the first inter-layer dielectric layer; and wherein the second mesh conductive layer and the plurality of second conductive islands are coupled to the plurality of second conductive buses through a plurality of second vias that are formed in the first inter-layer dielectric layer.

14. The semiconductor device of claim 11, wherein the first conductive islands formed right above every two adjacent first conductive buses of the plurality of first conductive buses are arranged in a staggered manner along the second direction, and the second conductive islands formed right above every two adjacent second conductive buses of the plurality of second conductive buses are arranged in a staggered manner along the second direction.

15. The semiconductor device of claim 11, wherein the plurality of first conductive islands are formed right above the plurality of first conductive buses and are distributed in a quincunx pattern, and the plurality of second conductive islands are formed right above the plurality of second conductive buses and are distributed in a quincunx pattern.

16. The semiconductor device of claim 13, wherein the plurality of first vias are formed in a plurality of first portions of the first inter-layer dielectric layer that are right above the plurality of first conductive buses, and the plurality of second vias are formed in a plurality of second portions of the first inter-layer dielectric layer that are right above the plurality of second conductive buses.

17. The semiconductor device of claim 16, wherein in a first portion of the first inter-layer dielectric layer that is in the predetermined first region, the plurality of first vias are formed right below the plurality of first conductive islands and right above the plurality of first conductive buses; and wherein in a second portion of the first inter-layer dielectric layer that is in the predetermined second region, the plurality of second vias are formed right below the plurality of second conductive islands and right above the plurality of second conductive buses.

18. The semiconductor device of claim 1, wherein an area of the predetermined first region and an area of the predetermined second region are substantially identical.

19. The semiconductor device of claim 1, wherein the predetermined first region and the predetermined second region are divided along a diagonal line of the semiconductor device.

20. The semiconductor device of claim 2, wherein the plurality of first tooth-shaped structures and the plurality of second tooth-shaped structures are arranged in an alternate order, and each of the first tooth-shaped structures is electrically isolated from the neighboring second tooth-shaped structures.

21. The semiconductor device of claim 1, wherein the routing structure further comprises:

an upper conductive routing layer formed above the intermediate conductive routing layer, wherein the upper conductive routing layer comprises a third conductive layer formed in the predetermined first region and a fourth conductive layer formed in the predetermined second region, and the third conductive layer and the fourth conductive layer are electrically isolated from each other; and wherein the third conductive layer is coupled to at least one of the plurality of first conductive islands and the fourth conductive layer is coupled to at least one of the plurality of second conductive islands.

22. The semiconductor device of claim 21, wherein the routing structure further comprises:

a second inter-layer dielectric layer formed between the upper conductive routing layer and the intermediate conductive routing layer; and wherein the third conductive layer is coupled to the plurality of first conductive islands through a plurality of third vias that are formed in the second inter-layer dielectric layer; and wherein the fourth conductive layer is coupled to the plurality of second conductive islands through a plurality of fourth vias that are formed in the second inter-layer dielectric layer.

23. The semiconductor device of claim 22, wherein the plurality of third vias correspond to the plurality of first conductive islands in a one-to-one correspondence manner.

24. The semiconductor device of claim 22, wherein the plurality of fourth vias correspond to the plurality of second conductive islands in a one-to-one correspondence manner.

25. The semiconductor device of claim 21, wherein a thickness of the upper conductive routing layer is larger than a thickness of the intermediate conductive routing layer.

26. The semiconductor device of claim 11, wherein a thickness of the intermediate conductive routing layer is larger than or equal to a thickness of the lower conductive routing layer.

27. The semiconductor device of claim 11, further comprising a plurality of double-diffused metal-oxide-semiconductor (DMOS) cells formed in a substrate, wherein each one of the plurality of DMOS cells comprises a source region and a drain region, the source region is electrically coupled to one of the plurality of first conductive buses, and the drain region is electrically coupled to one of the plurality of second conductive buses.

28. The semiconductor device of claim 27, wherein each one of the plurality of DMOS cells further comprises a gate region that, in a top view, surrounds a corresponding one of the plurality of first conductive buses.

29. A semiconductor device, comprising:

a routing structure formed on a substrate, wherein the routing structure includes an intermediate conductive routing layer having a first mesh conductive layer and a second mesh conductive layer disposed respectively in a predetermined second region and a predetermined first region of the semiconductor device, and the first mesh conductive layer and the second mesh conductive layer are electrically isolated from each other; and a lower conductive routing layer formed below the intermediate conductive routing layer, wherein the lower conductive routing layer comprises a plurality of first conductive buses and a plurality of second conductive buses that extend in a first direction and are arranged in an alternate order along a second direction that is perpendicular to the first direction.

30. The semiconductor device of claim 29, wherein the intermediate conductive routing layer further comprises a plurality of first conductive islands formed in the predetermined first region and a plurality of second conductive islands formed in the predetermined second region.

31. The semiconductor device of claim 30, wherein at a border region between the first mesh conductive layer and the second mesh conductive layer, the first mesh conductive layer has a plurality of first tooth-shaped structures extending from the first mesh conductive layer towards the second mesh conductive layer, and the second mesh conductive layer has a plurality of second tooth-shaped structures extending from the second mesh conductive layer towards the first mesh conductive layer.

32. The semiconductor device of claim 31, wherein each one of the plurality of first tooth-shaped structures is integrated or merged with at least one of the plurality of first conductive islands.

33. The semiconductor device of claim 32, wherein the plurality of first conductive islands that are not integrated or merged with the plurality of first tooth-shaped structures are referred to as unintegrated first conductive islands, and wherein the second mesh conductive layer envelops the unintegrated first conductive islands and is electrically isolated from the unintegrated first conductive islands.

34. The semiconductor device of claim 31, wherein each one of the plurality of second tooth-shaped structures is integrated or merged with at least one of the plurality of second conductive islands.

35. The semiconductor device of claim 34, wherein the plurality of second conductive islands that are not integrated or merged with the plurality of second tooth-shaped structures are referred to as unintegrated second conductive islands, and wherein the first mesh conductive layer envelops the unintegrated second conductive islands and is electrically isolated from the unintegrated second conductive islands.

36. The semiconductor device of claim 30, wherein the plurality of first conductive islands are arranged in multiple rows along a first direction, and the first conductive islands in every two adjacent rows are arranged in a staggered manner along a second direction perpendicular to the first direction, and wherein the second conductive islands are arranged in multiple rows along the first direction, and the second conductive islands in every two adjacent rows are arranged in a staggered manner along the second direction.

37. The semiconductor device of claim 30, wherein the plurality of first conductive islands are arranged in a quincunx pattern, and wherein the plurality of second conductive islands are arranged in a quincunx pattern.

38. The semiconductor device of claim 30, wherein the first mesh conductive layer and at least one of the plurality of first conductive islands are coupled to at least one of the plurality of first conductive buses, and wherein the second mesh conductive layer and at least one of the plurality of second conductive islands are coupled to at least one of the plurality of second conductive buses.

39. The semiconductor device of claim 30, wherein the first conductive islands formed right above every two adjacent first conductive buses of the plurality of first conductive buses are arranged in a staggered manner along the second direction, and the second conductive islands formed right above every two adjacent second conductive buses of the plurality of second conductive buses are arranged in a staggered manner along the second direction.

40. The semiconductor device of claim 30, wherein the plurality of first conductive islands are formed right above the plurality of first conductive buses and are distributed in a quincunx pattern, and the plurality of second conductive islands are formed right above the plurality of second conductive buses and are distributed in a quincunx pattern.

41. The semiconductor device of claim 29, wherein an area of the predetermined first region and an area of the predetermined second region are substantially identical.

42. The semiconductor device of claim 29, wherein the predetermined first region and the predetermined second region are divided along a diagonal line of the semiconductor device.

43. The semiconductor device of claim 31, wherein the plurality of first tooth-shaped structures and the plurality of second tooth-shaped structures are arranged in an alternate order, and each of the first tooth-shaped structures is electrically isolated from the neighboring second tooth-shaped structures.

44. The semiconductor device of claim 30, wherein the routing structure further comprises:

an upper conductive routing layer formed above the intermediate conductive routing layer, wherein the upper conductive routing layer comprises a third conductive layer formed in the predetermined first region and a fourth conductive layer formed in the predetermined second region, and the third conductive layer and the fourth conductive layer are electrically isolated from each other; and wherein the third conductive layer is coupled to at least one of the plurality of first conductive islands and the fourth conductive layer is coupled to at least one of the plurality of second conductive islands.

* * * * *